(12) United States Patent
Kim et al.

(10) Patent No.: US 11,882,728 B2
(45) Date of Patent: Jan. 23, 2024

(54) MULTI-SCREEN DISPLAY DEVICE FOR REDUCING A NON-DISPLAY AREA BETWEEN DISPLAY PANELS, AND MANUFACTURING METHOD THEREOF

(71) Applicant: Samsung Display Co., Ltd., Yongin-si (KR)

(72) Inventors: Won Tae Kim, Yongin-si (KR); Chang Hyeok Choi, Yongin-si (KR); Yong Sik Hwang, Yongin-si (KR); Jang Bog Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 242 days.

(21) Appl. No.: 17/444,271

(22) Filed: Aug. 2, 2021

(65) Prior Publication Data
US 2022/0093712 A1   Mar. 24, 2022

(30) Foreign Application Priority Data
Sep. 22, 2020   (KR) .......................... 10-2020-0122597

(51) Int. Cl.
*H10K 59/121* (2023.01)
*H10K 50/842* (2023.01)
(Continued)

(52) U.S. Cl.
CPC ..... *H10K 59/1213* (2023.02); *H10K 50/8426* (2023.02); *H10K 71/00* (2023.02); *H10K 77/111* (2023.02)

(58) Field of Classification Search
CPC ........... H10K 59/1213; H10K 50/8426; H10K 71/00; H10K 77/111; H10K 71/851;
(Continued)

(56) References Cited

U.S. PATENT DOCUMENTS

| 8,209,894 B2* | 7/2012 | Shim | ..................... G06F 1/1616 |
| | | | 345/1.3 |
| 8,223,087 B2* | 7/2012 | Lee | ..................... G02F 1/13336 |
| | | | 345/1.3 |

(Continued)

FOREIGN PATENT DOCUMENTS

KR   10-2020-0047862 A   5/2020

*Primary Examiner* — J. E. Schoenholtz
(74) *Attorney, Agent, or Firm* — Lewis Roca Rothgerber Christie LLP

(57) ABSTRACT

A display device includes: first and second display panels adjacent to each other along one direction, wherein: each of the first and second display panels includes a substrate, and a display portion on the substrate and includes a plurality of pixels including a pixel circuit layer on the substrate, at least one transistor, a display element layer on the pixel circuit layer, and at least one light emitting element emitting light; the substrate of the first display panel and the substrate of the second display panel are engaged with each other in a plan view and a cross-sectional view; the display portion of the first display panel and the display portion of the second display panel are engaged with each other in a plan view and a cross-sectional view; and a boundary between the display portion of the first display panel and the display portion of the second display panel.

20 Claims, 24 Drawing Sheets

(51) Int. Cl.
*H10K 71/00* (2023.01)
*H10K 77/10* (2023.01)

(58) Field of Classification Search
CPC ...... H10K 59/18; H10K 59/12; H10K 59/121; H10K 50/00; Y02E 10/549; G09F 9/301; G09F 9/302; G09F 9/3026; G09F 9/35; G09F 9/372; G02B 26/005; H01L 25/0753; H01L 33/0012
See application file for complete search history.

(56) References Cited

U.S. PATENT DOCUMENTS

| | | | | |
|---|---|---|---|---|
| 8,508,432 | B2* | 8/2013 | Shim | G06F 1/1601 |
| | | | | 345/1.3 |
| 8,582,049 | B2* | 11/2013 | Shim | G06F 1/1652 |
| | | | | 349/73 |
| 2008/0224949 | A1* | 9/2008 | Lee | H10K 59/18 |
| | | | | 345/1.3 |
| 2015/0028316 | A1* | 1/2015 | Kojima | H10K 50/805 |
| | | | | 257/40 |
| 2017/0031643 | A1* | 2/2017 | Jeong | G06F 1/1647 |
| 2018/0039471 | A1* | 2/2018 | Yanagisawa | G06F 3/0412 |
| 2020/0133614 | A1 | 4/2020 | Oh et al. | |
| 2020/0295119 | A1* | 9/2020 | Yueh | H05K 1/189 |
| 2021/0159307 | A1* | 5/2021 | Kwon | H10K 59/18 |
| 2021/0343827 | A1* | 11/2021 | Nakamura | H10K 77/111 |
| 2022/0013591 | A1* | 1/2022 | Miyake | H10K 59/18 |
| 2022/0404660 | A1* | 12/2022 | Yanagisawa | G06F 3/14 |

* cited by examiner

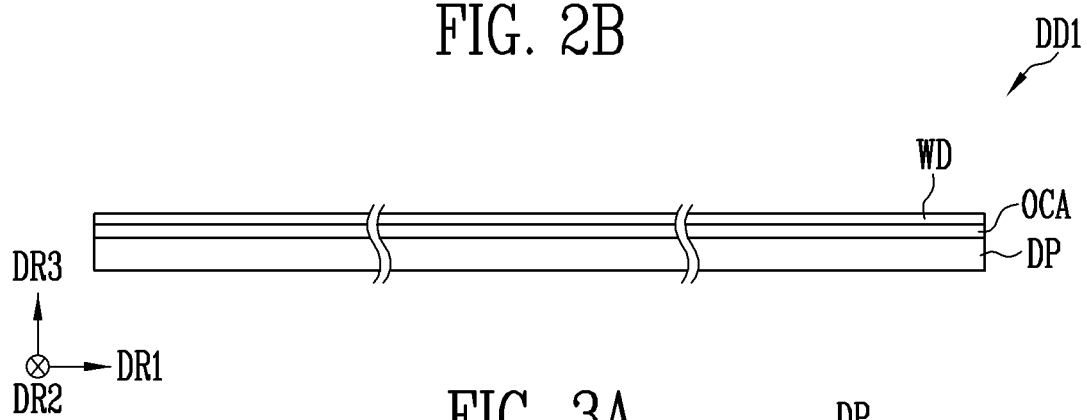
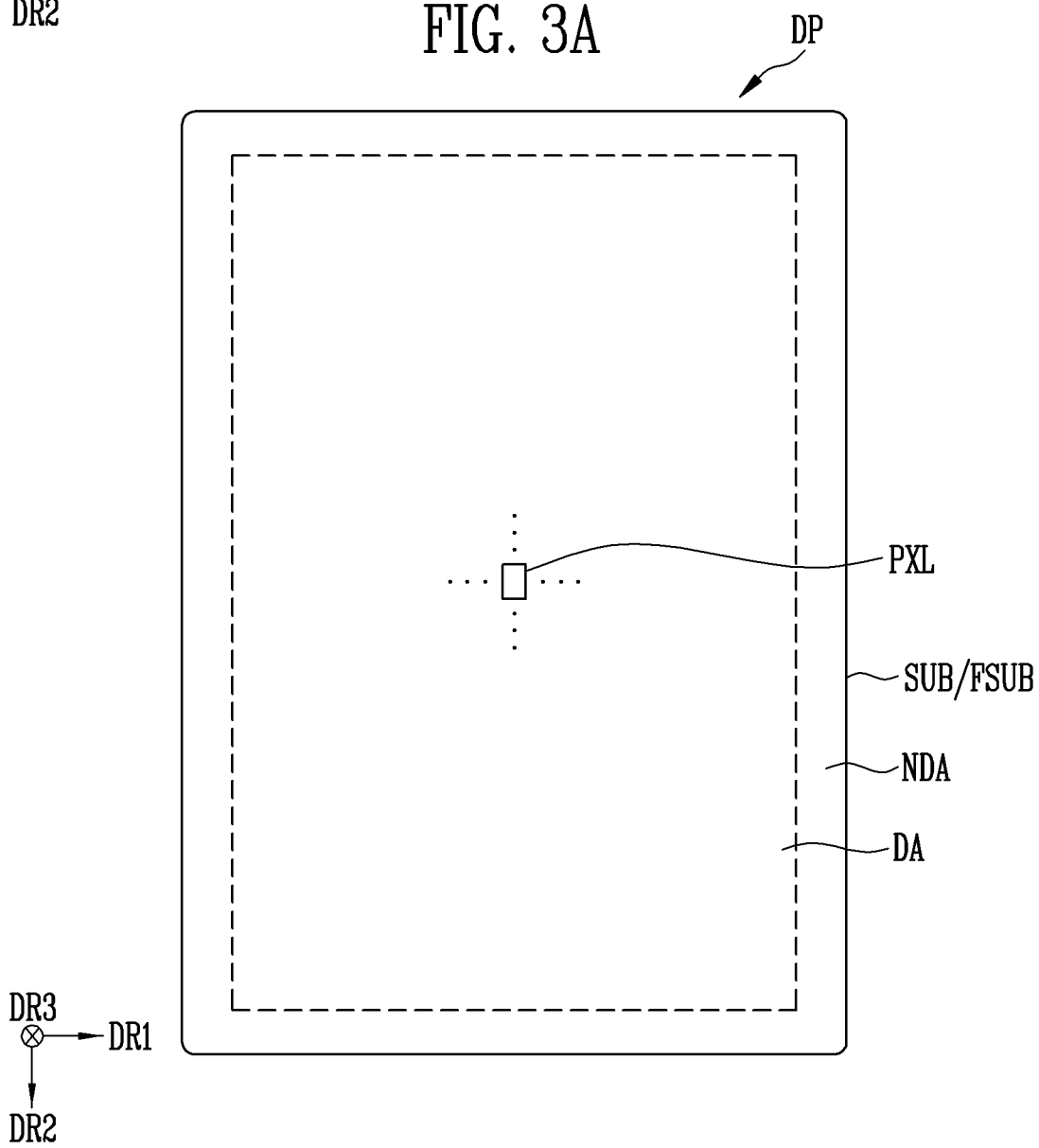

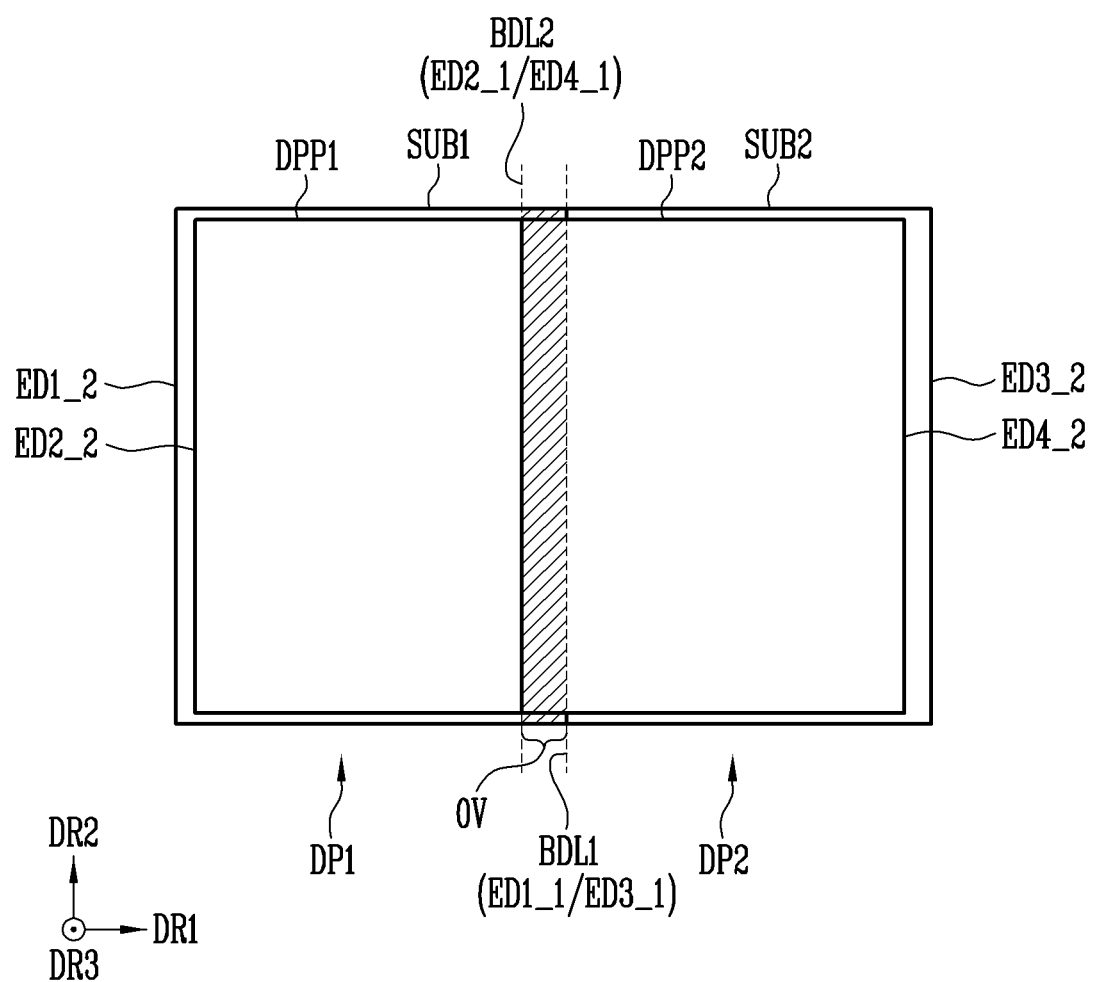

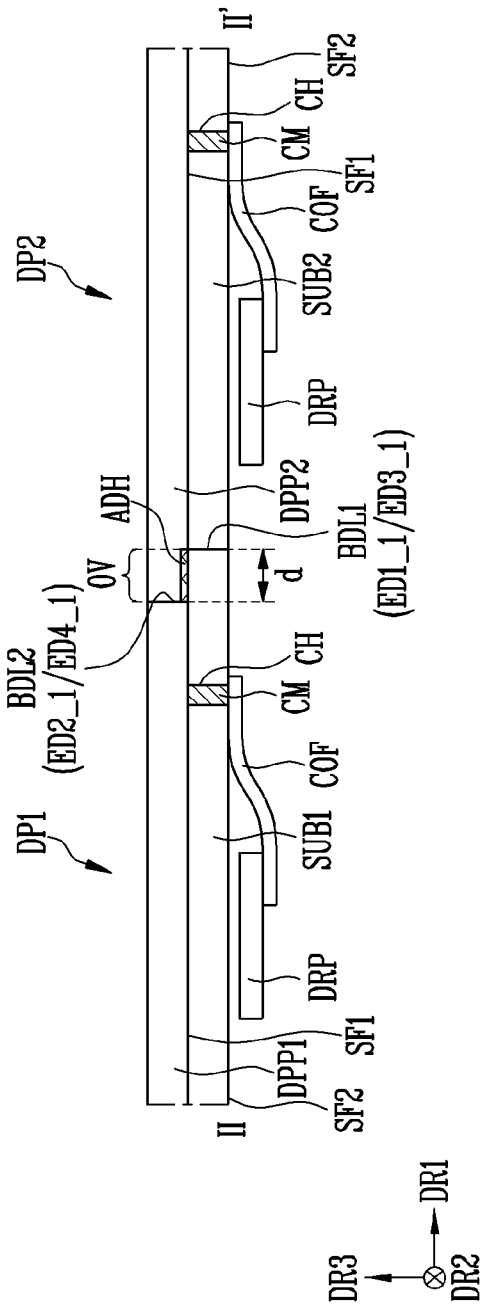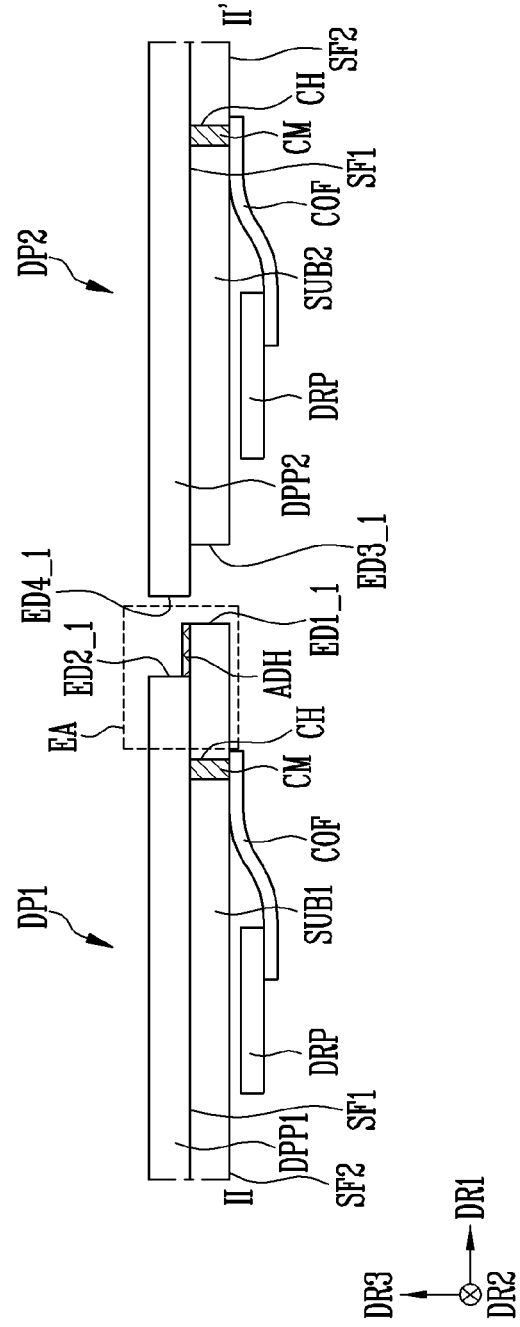

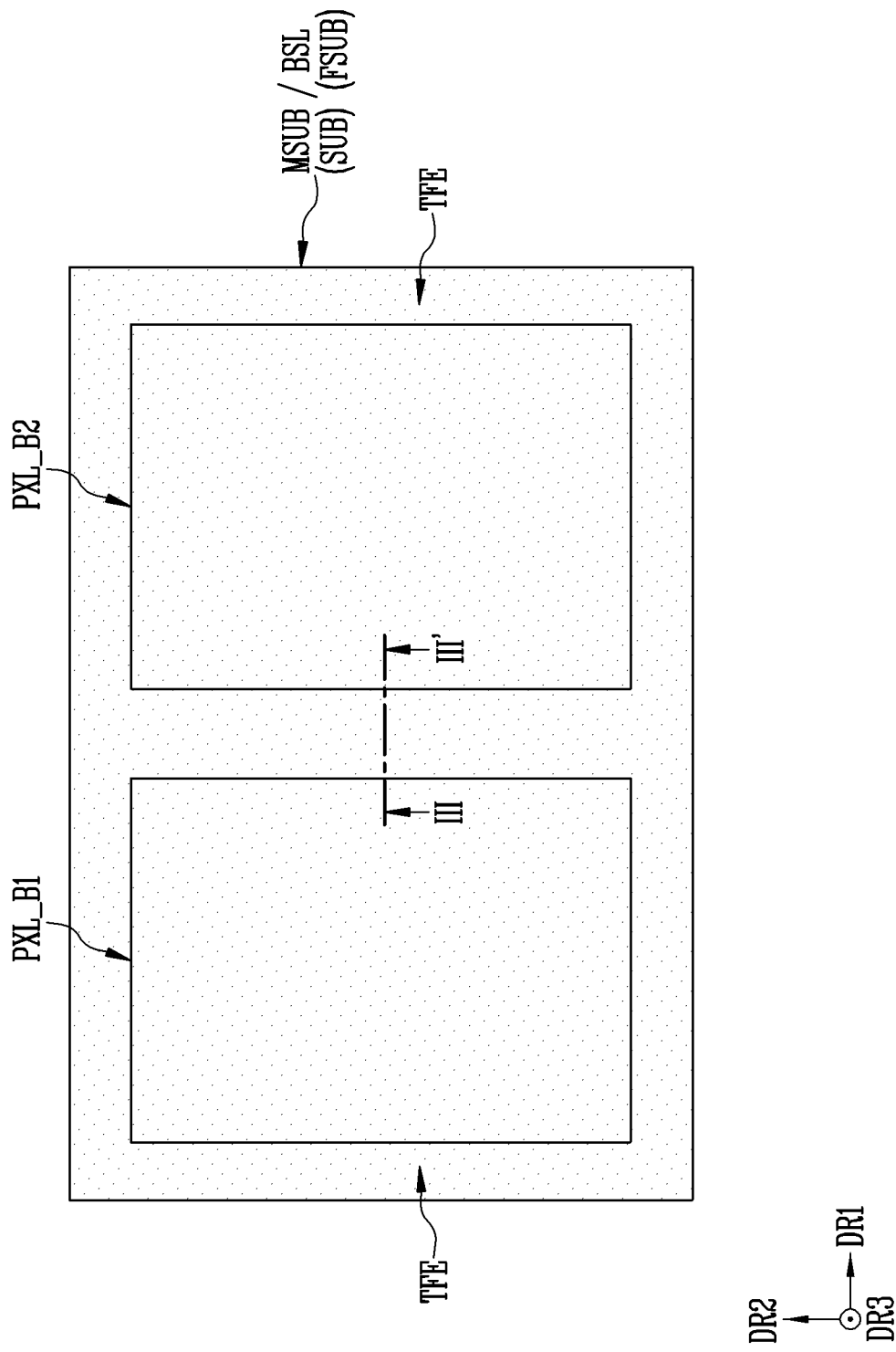

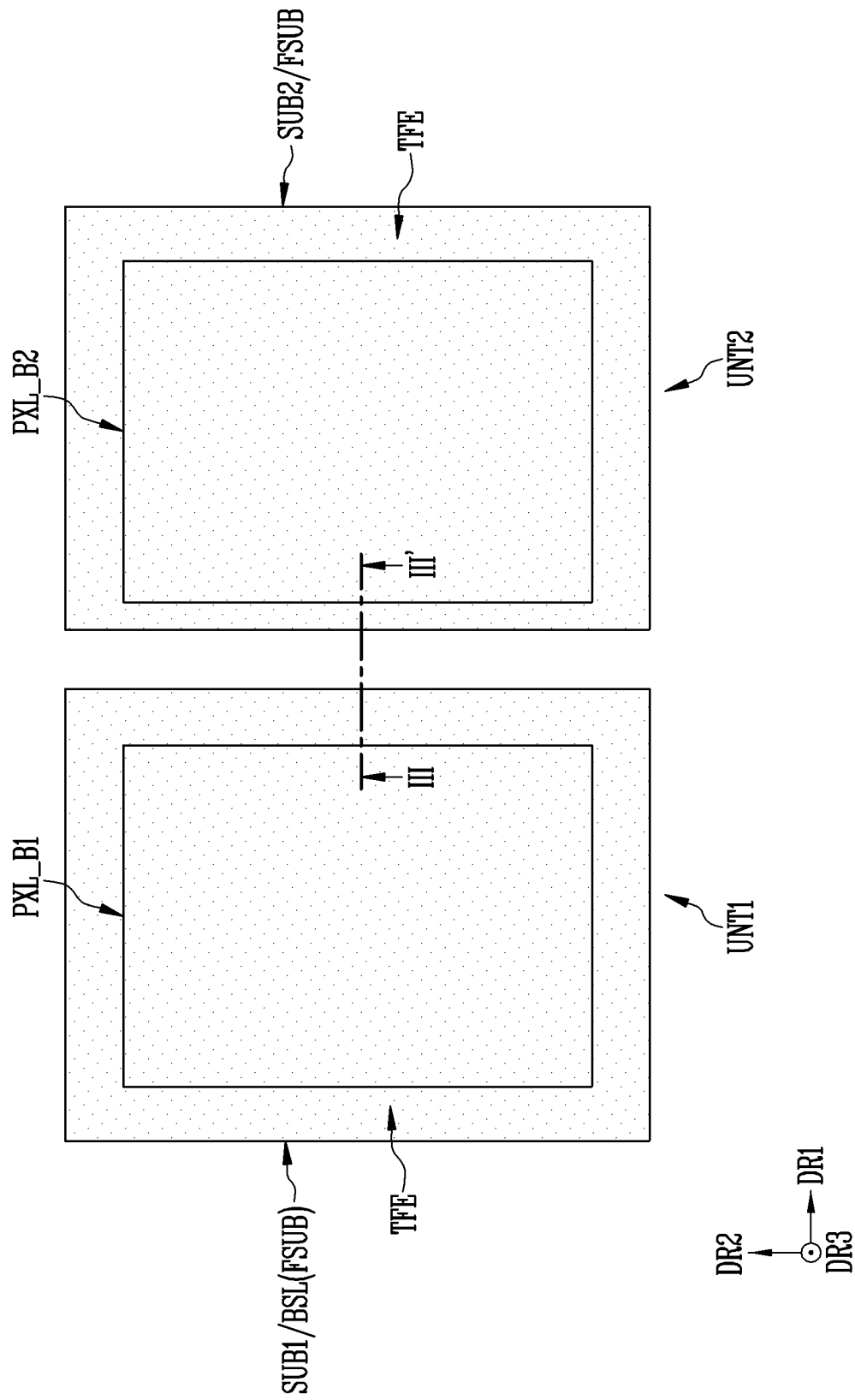

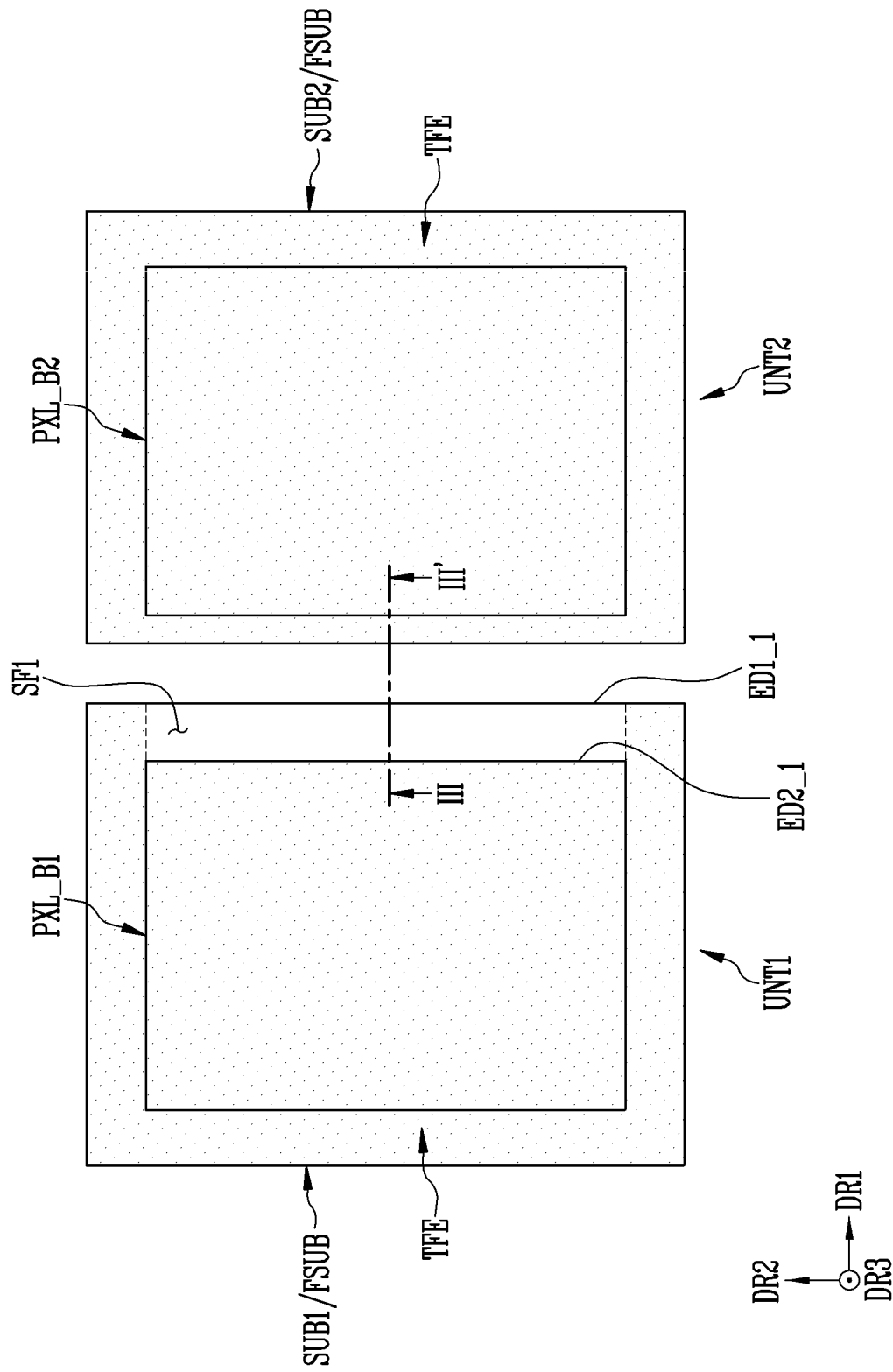

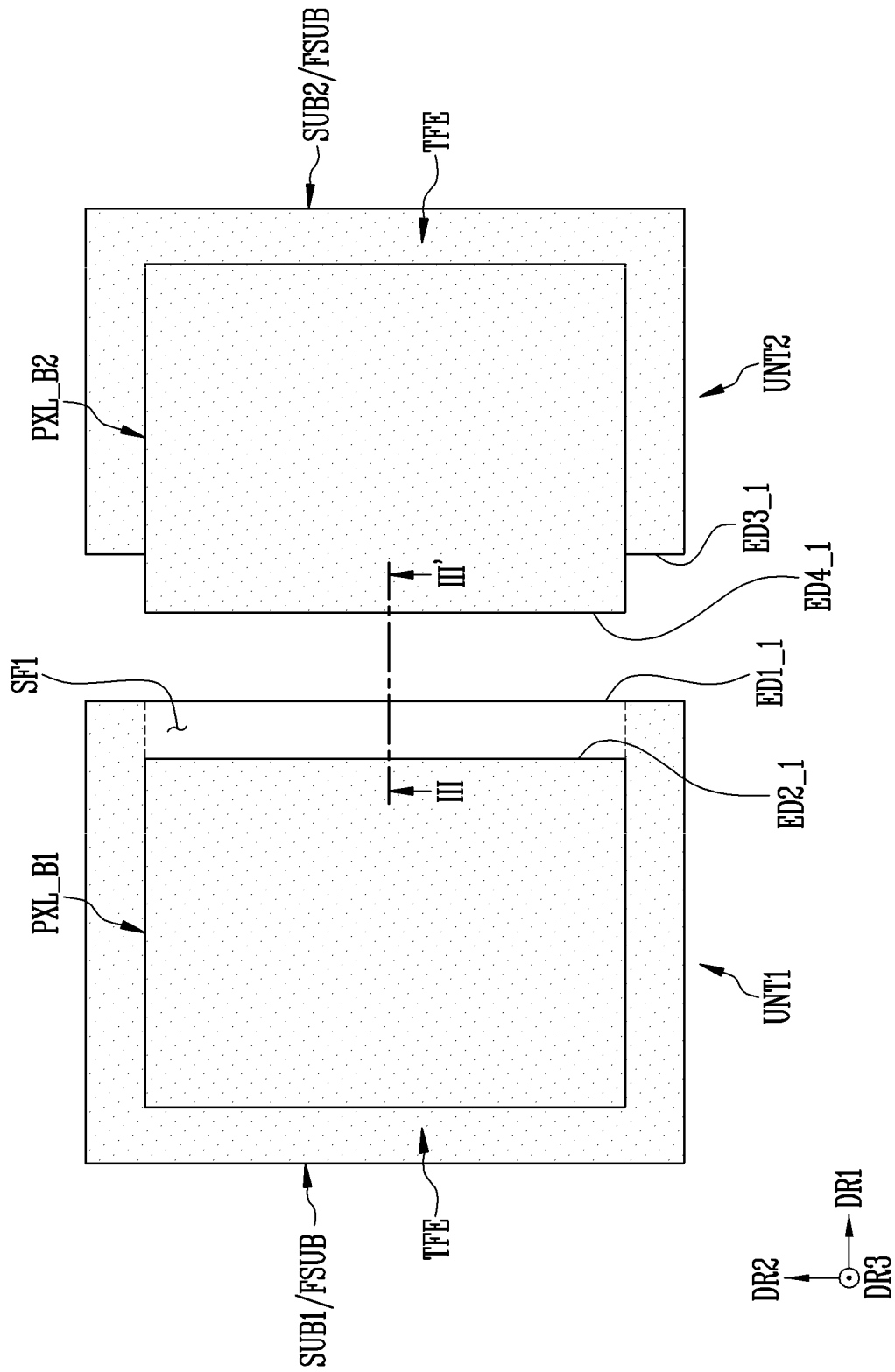

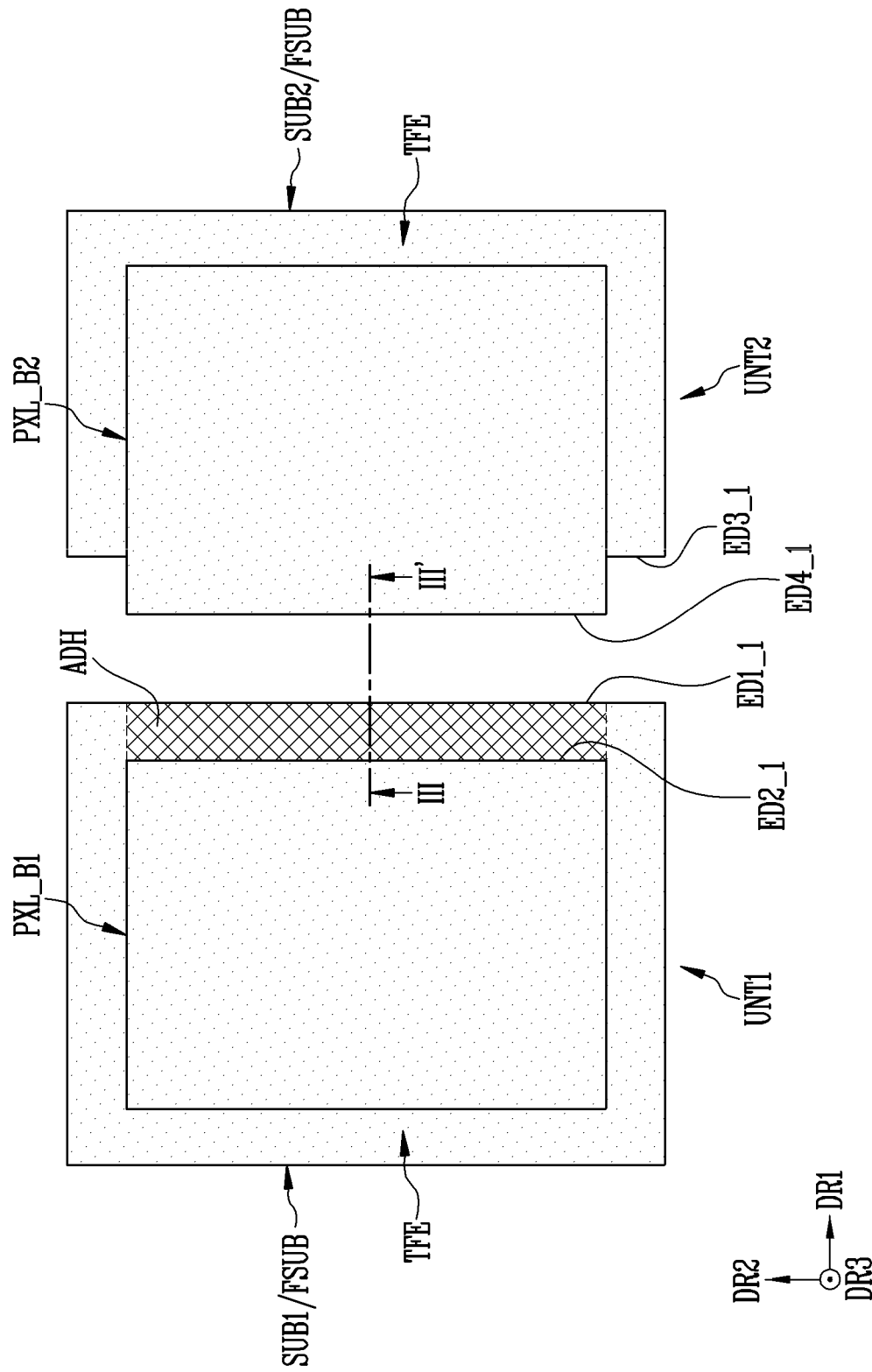

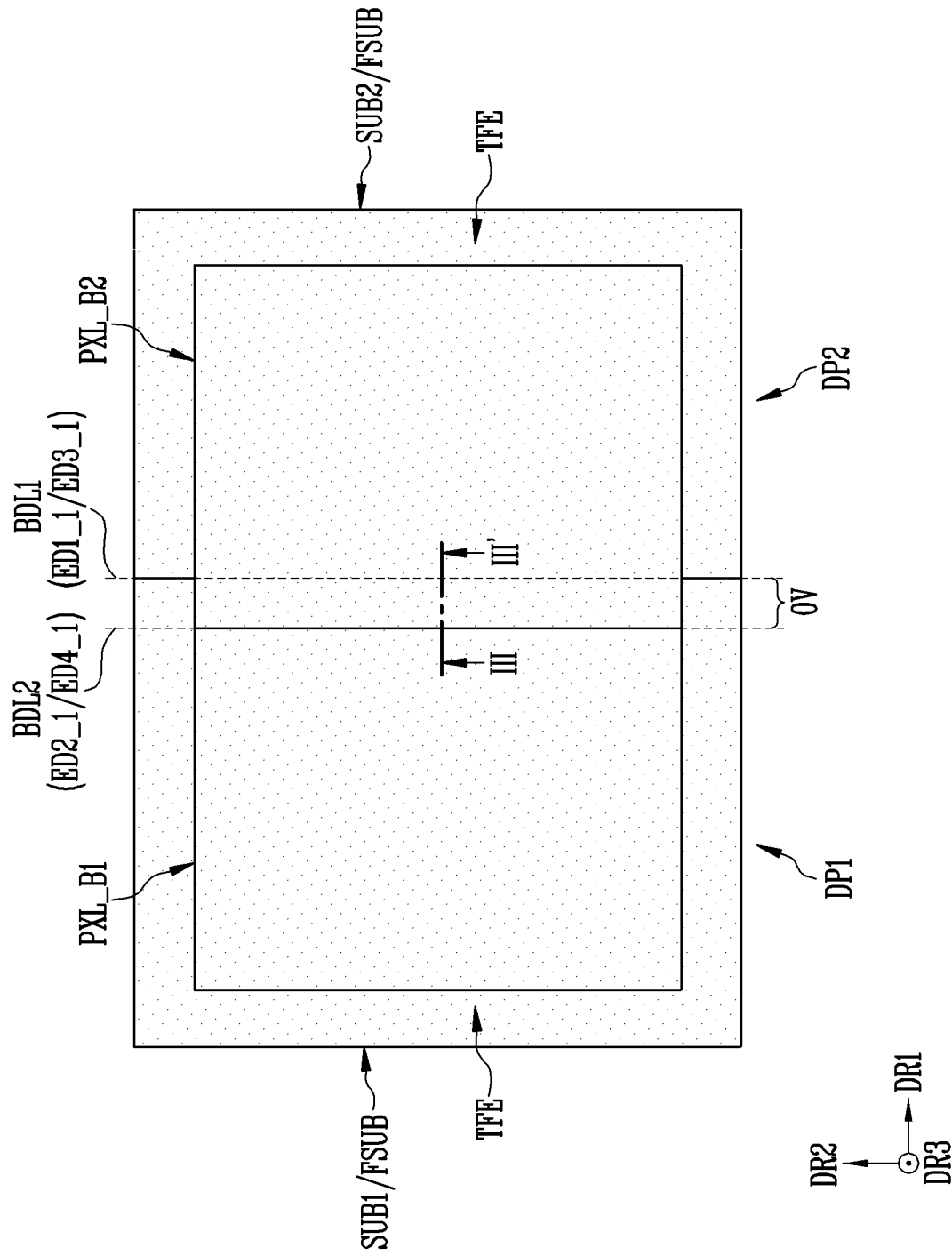

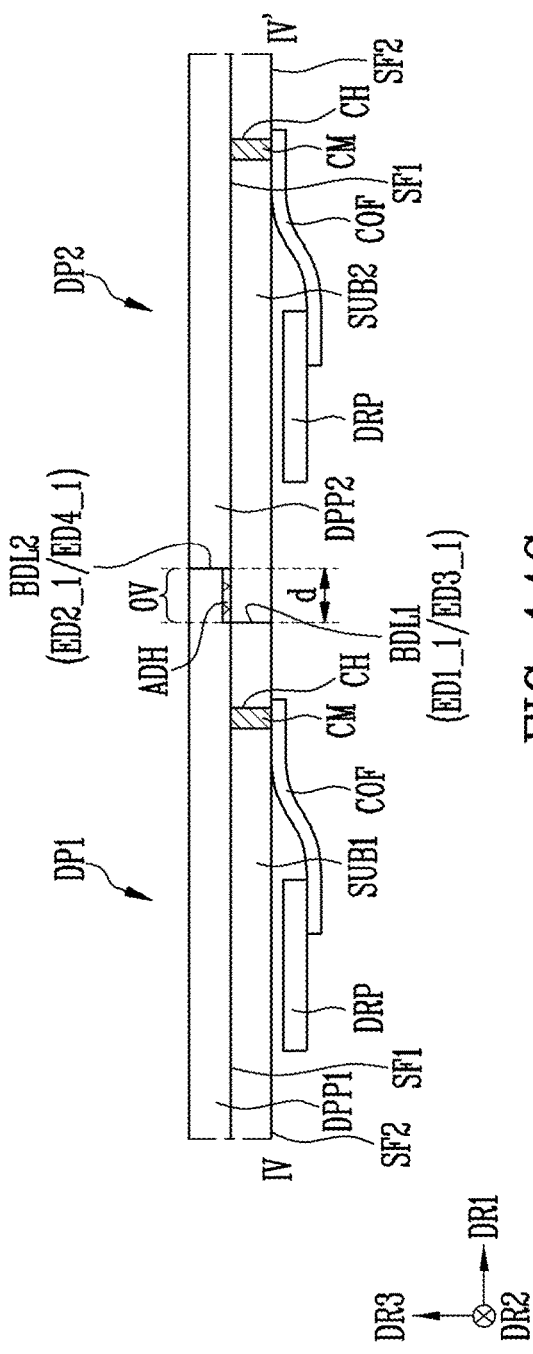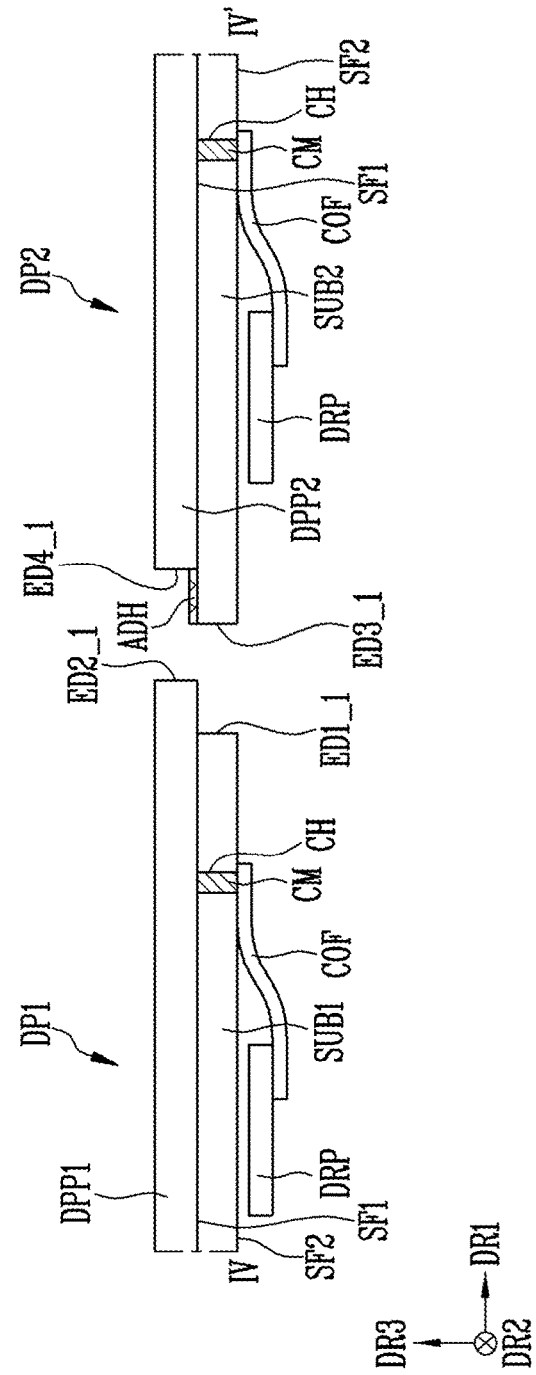

MULTI-SCREEN DISPLAY DEVICE FOR REDUCING A NON-DISPLAY AREA BETWEEN DISPLAY PANELS, AND MANUFACTURING METHOD THEREOF

CROSS-REFERENCE TO RELATED APPLICATION

The present application claims priority to and the benefit of Korean Patent Application No. 10-2020-0122597 filed in the Korean Intellectual Property Office on Sep. 22, 2020, the entire content of which is incorporated herein by reference.

BACKGROUND

1. Field

Aspects of some embodiments of the present invention relate to a display device and a manufacturing method thereof.

2. Description of the Related Art

As the interest in devises for graphically displaying information has increased over time, and the demand for using a portable information medium increases, the demand and commercialization for a display devices has increased.

The above information disclosed in this Background section is only for enhancement of understanding of the background and therefore the information discussed in this Background section does not necessarily constitute prior art.

SUMMARY

Aspects of some embodiments of the present invention include a display device and a manufacturing method thereof that may minimize or reduce a non-display area between display panels.

Aspects of some embodiments of the present invention include a display device including: first and second display panels adjacent to each other in one direction. Each of the first and second display panels may include a substrate, and a display portion that is provided on the substrate and includes a plurality of pixels.

According to some embodiments, each of the pixels may include a pixel circuit layer that is on the substrate and includes at least one transistor, and a display element layer that is on the pixel circuit layer and includes at least one light emitting element emitting light.

According to some embodiments, the substrate of the first display panel and the substrate of the second display panel may be engaged with each other in a plan view and a cross-sectional view, and the display portion of the first display panel and the display portion of the second display panel may be engaged with each other in a plan view and a cross-sectional view.

According to some embodiments, a first boundary between the substrate of the first display panel and the substrate of the second display panel and a second boundary between the display portion of the first display panel and the display portion of the second display panel may be spaced apart from each other in the one direction, between the first display panel and the second display panel.

According to some embodiments, the display device may further include an overlapping portion in which the first display panel and the second display panel overlap. When viewed in a plan view and a cross-sectional view, the overlapping portion may be between the first boundary and the second boundary.

According to some embodiments, the substrate may include a first surface and a second surface facing each other. The display portion may further include a flexible substrate provided between the first surface of the substrate and the plurality of pixels.

According to some embodiments, at least a portion of the display portion of the other of the first and second display panels may be on the first surface of the substrate of one of the first and second display panels in the overlapping portion.

According to some embodiments, at least a portion of the display portion of the second display panel may be on the first surface of the substrate of the first display panel in the overlapping portion.

According to some embodiments, the display device may further include an adhesive layer on the first surface of the substrate of the display panel in the overlapping portion.

According to some embodiments, the display portion of the second display panel may be on the adhesive layer.

According to some embodiments, when viewed in a plan view and a cross-sectional view, the first boundary may overlap the display portion of the second display panel. When viewed in a plan view and a cross-sectional view, the second boundary may overlap the substrate of the first display panel.

According to some embodiments, when viewed in a cross-sectional view, the first boundary may be below the display portion of the second display panel.

According to some embodiments, an edge of the substrate of the first display panel may protrude in a direction of the second display panel compared to an edge of a display portion of a corresponding display panel, between the first display panel and the second display panel.

According to some embodiments, an edge of the display portion of the second display panel may protrude in a direction of the first display panel compared to an edge of a substrate of a corresponding display panel, between the first display panel and the second display panel.

According to some embodiments, at least a portion of the display portion of the first display panel may be on the first surface of the substrate of the second display panel.

According to some embodiments, when viewed in a plan view and a cross-sectional view, the first boundary may overlap the display portion of the first display panel. When viewed in a plan view and a cross-sectional view, the second boundary may overlap the substrate of the second display panel.

According to some embodiments, an edge of the substrate of the second display panel may protrude in a direction of the first display panel compared to an edge of a display portion of a corresponding display panel, between the first display panel and the second display panel.

According to some embodiments, an edge of the display portion of the first display panel may protrude in a direction of the second display panel compared to an edge of a substrate of a corresponding display panel, between the first display panel and the second display panel.

According to some embodiments, when viewed in a cross-sectional view, the first boundary may be below the display portion of the first display panel.

According to some embodiments, the display device may further include an additional member that is between the substrate of the first display panel and the substrate of the second display panel and is flexible, between the first display panel and the second display panel. The additional member may contact the display portion of the first display panel.

According to some embodiments, each of the first and second display panels may further include: at least one contact hole penetrating at least one area of the substrate of a corresponding display panel; a conductive material in the contact hole; and a driver on the second surface of the substrate and electrically connected to the conductive material.

According to some embodiments, the light emitting element may include: a first electrode electrically connected to the transistor; an emission layer on the first electrode; and a second electrode on the emission layer.

According to some embodiments, the light emitting element may include: a first semiconductor layer doped with a first conductive dopant; a second semiconductor layer doped with a second conductive dopant different from the first conductive dopant;

and an active layer between the first semiconductor layer and the second semiconductor layer.

According to some embodiments of the present invention, a manufacturing method of a display device includes: preparing a mother substrate in which a first display portion and a second display portion are provided; separating the mother substrate into a first substrate provided with the first display portion and a second substrate provided with the second display portion by removing a portion of the mother substrate; removing at least a portion of the first substrate to expose one surface of the first substrate; removing at least a portion of the second substrate to expose at least a portion of the second display; applying an adhesive resin on one surface of the exposed first substrate; and bonding the first substrate and the second substrate after arranging the exposed second display portion on the adhesive resin.

In a display device and the manufacturing method thereof, according to some embodiments of the present invention, adjacent display panels in one direction may be at least partially overlap and be combined with each other. Therefore, a non-display area between adjacent display panels is minimized, so that when a display device using a plurality of display panels is implemented, it is possible to prevent a boundary area between adjacent displays from being viewed.

In addition, in the display device and the manufacturing method thereof, according to some embodiments of the present invention, it may be possible to increase user immersion while providing relatively improved visual information.

The characteristics and features of embodiments of the present invention are not limited by what is illustrated in the above, and more various characteristics are illustrated and described in the present specification.

BRIEF DESCRIPTION OF THE DRAWINGS

FIG. 2B illustrates a schematic cross-sectional view of the first display device of FIG. 2A according to some embodiments of the present invention.

FIG. 3A illustrates a schematic top plan view of a display panel according to some embodiments of the present invention.

FIG. 6A and FIG. 6B illustrate schematic top plan views of a display device according to some embodiments of the present invention.

FIG. 7 illustrates a cross-sectional view taken along the line II-II' of FIG. 6B according to some embodiments of the present invention.

FIG. 8 illustrates a schematic cross-sectional view of a state in which a first display panel and a second display panel of FIG. 7 are separated according to some embodiments of the present invention.

FIG. 12A to FIG. 12F are schematic top plan views sequentially showing a manufacturing method of a display device according to some embodiments of the present invention.

FIG. 14B illustrates a cross-sectional view taken along the line IV-IV' of FIG. 14A.

FIG. 14C illustrates a schematic cross-sectional view of a state in which a first display panel and a second display panel of FIG. 14B are separated according to some embodiments of the present invention.

DETAILED DESCRIPTION

Figure 1:
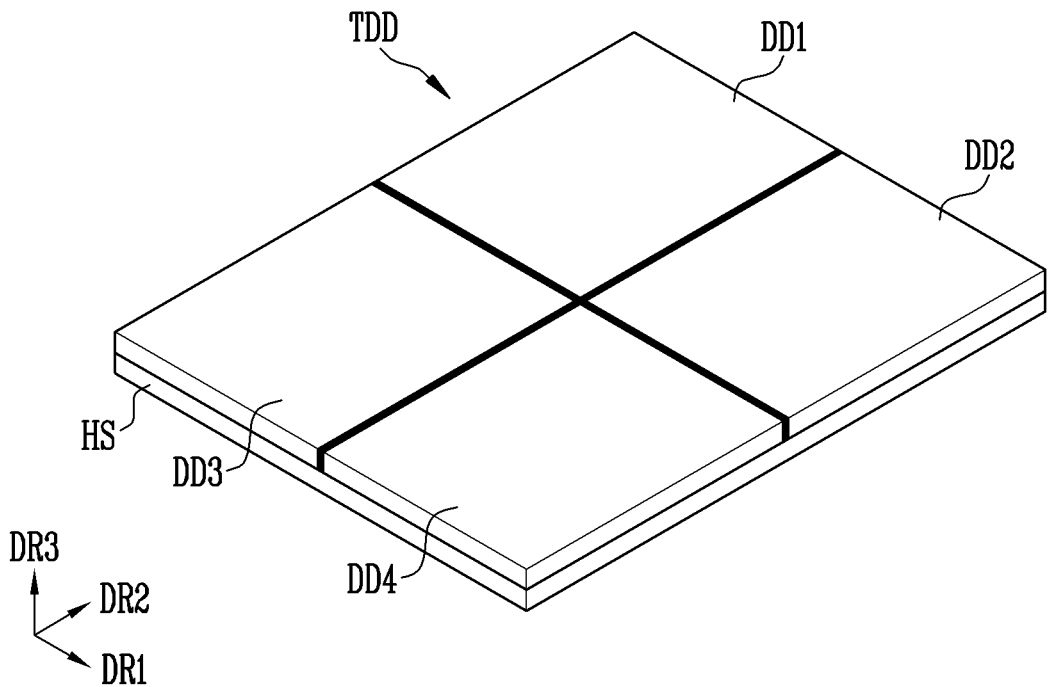
FIG. 1 illustrates a schematic perspective view of a multi-screen display device according to some embodiments of the present invention.

Because the present invention may be variously modified and have various forms, embodiments will be illustrated and described in detail in the following. This, however, by no means restricts the invention to the specific embodiments, and it is to be understood as embracing all included in the spirit and scope of the present invention changes, equivalents, and substitutes.

Like reference numerals are used for like constituent elements in describing each drawing. In the accompanying drawings, the dimensions of the structure are exaggerated and shown for clarity of the present invention. Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the present invention. Singular forms are intended to include plural forms unless the context clearly indicates otherwise.

In the present application, it should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. It will be understood that when an element such as a layer, film, region, area, or substrate is referred to as being "on" another element, it can be directly on the other element or intervening elements may also be present. In addition, in the present specification, when a portion of a layer, film, region, area, plate, or the like is referred to as being formed "on" another portion, the formed direction is not limited to an upper direction but includes a lateral or lower direction. In contrast, when a portion of a layer, film, region, area, plate, or the like is referred to as being "below" another portion, it may be directly below the other portion, or intervening portions may be present.

It is to be understood that, in the present application, when it is described for one constituent element (for example, a first constituent element) to be (functionally or communicatively) "coupled or connected with/to" another constituent element (for example, a second constituent element), the one constituent element may be directly coupled or connected with/to the another constituent element, or may be coupled or connected with/to through the other constituent element (for example, a third constituent element). In contrast, it is to be understood that when it is described for one constituent element (for example, a first constituent element) to be "directly coupled or connected with/to" another constituent element (for example, a second constituent element), there is no other constituent element (for example, a third constituent element) between the one constituent element and the another constituent element.

Hereinafter, with reference to accompanying drawings, aspects of some embodiments of the present invention will be described in more detail. In the description below, singular forms are to include plural forms unless the context clearly indicates only the singular.

Figure 2A:
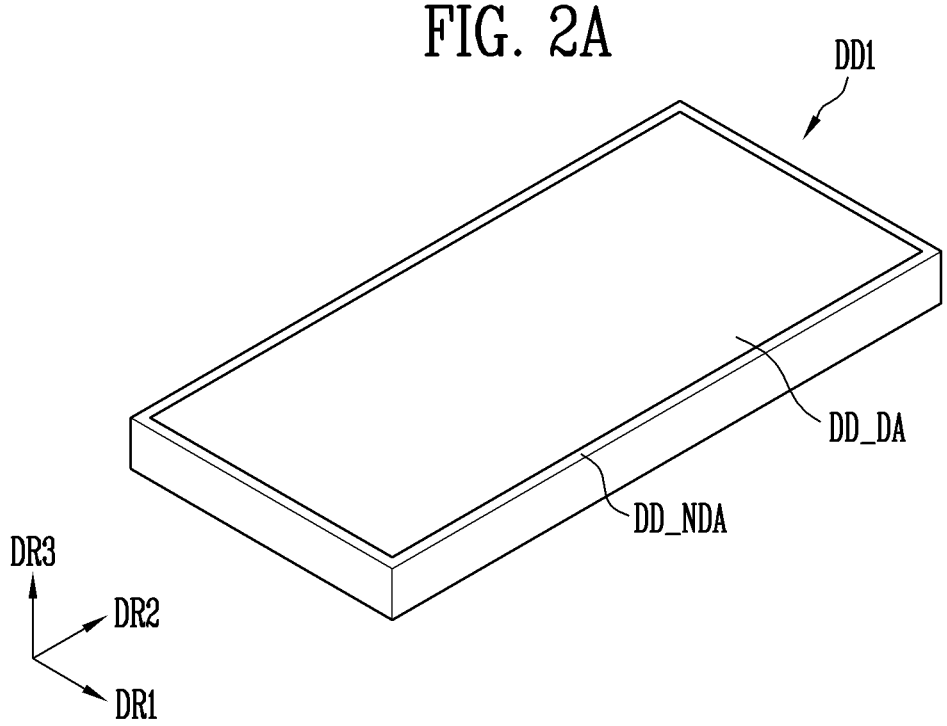
FIG. 2A illustrates a schematic perspective view of a first display device of FIG. 1 according to some embodiments of the present invention.

FIG. 1 illustrates a schematic perspective view of a multi-screen display device according to some embodiments of the present invention, FIG. 2A illustrates a schematic perspective view of a first display device of FIG. 1, and FIG. 2B illustrates a schematic cross-sectional view of the first display device of FIG. 2A.

Referring to FIG. FIG. 1 to FIG. 2B, a display device according to some embodiments of the present invention may be a multi-screen display device including a plurality of display devices DD1 to DD4 that are arranged adjacent to each other to form a larger display panel comprising the display devices DD1 to DD4 collectively. Although four display devices are shown for purposes of illustration, embodiments are not limited thereto, and some embodiments may include additional display devices or fewer display devices without departing from the spirit and scope of embodiments according to the present disclosure.

When a display device DD is one in which a display surface is applied to at least one surface thereof such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable device, embodiments according to the present invention may be applied thereto.

A multi-screen display device TDD (or referred to as a tiled display) may include a plurality of display devices DD1 to DD4 arranged in a matrix format along a first direction DR1 and a second direction DR2, and a housing HS.

The plurality of display devices DD1 to DD4 may display individual images, or may divide and display one image. The plurality of display devices DD1 to DD4 may include, for example, a first display device DD1, a second display device DD2, a third display device DD3, and a fourth display device DD4.

The first to fourth display devices DD1 to DD4 may be arranged side by side so that each display surface (or image display surface) on which an image is displayed is directed to one direction (for example, a third direction DR3). The first to fourth display devices DD1 to DD4 may have the same size (or area) with each other, but the present invention is not limited thereto. In some embodiments, each of the first to fourth display devices DD1 to DD4 may have a size (or area) different from that of adjacent display devices to meet design conditions of the applied multi-screen display device TDD.

Each of the first to fourth display devices DD1 to DD4 may be provided in various shapes, and as an example, may be provided in a rectangular plate shape having two pairs of sides parallel to each other, but embodiments according to the present invention are not limited thereto. When each of the first to fourth display devices DD1 to DD4 is provided in the rectangular plate shape, one of the two pairs of sides may be provided to be longer than the other a pair of sides. According to some embodiments of the present invention, for better understanding and ease of description, a case in which each of the first to fourth display devices DD1 to DD4 has a rectangular shape with a pair of long sides and a pair of short sides is illustrated, and an extending direction of the long side is indicated as the second direction DR2, an extending direction of the short side is indicated as the first direction DR1, and a direction vertical to the extending directions of the long and short sides is indicated as the third direction DR3. In this case, each of the first to fourth display devices DD1-DD4 provided in the rectangular plate shape may have a round shape at a corner where one long side and one short side meet.

The first to fourth display devices DD1 to DD4 may be arranged in a matrix format. The matrix format may include at least one or more rows and at least two or more columns.

The housing HS may physically combine the first to fourth display devices DD1 to DD4 so that the first to fourth display devices DD1 to DD4 may form one multi-screen display device TDD. The housing HS is arranged on one surface (or lower surface) of the first to fourth display devices DD1 to DD4 to control or fix movement of the first to fourth display devices DD1 to DD4. Each of the first to fourth display devices DD1 to DD4 may be detachably fastened to the housing HS through at least one fastening member. Accordingly, because it may be relatively easy to attach and detach each of the first to fourth display devices DD1 to DD4 from the housing HS, when one of the first to fourth display devices DD1 to DD4 is defective, it may be easily repaired.

The first to fourth display devices DD1 to DD4 may have substantially similar or same structure. Therefore, a description of the second to fourth display devices DD2 to DD4 will be replaced with a description of the first display device DD1 to be described with reference to FIG. 2A and 2B.

According to some embodiments of the present invention, at least a portion of the first display device DD1 may have flexibility, and the first display device DD1 may be folded at the portion having the flexibility.

The first display device DD1 may include a display area DD_DA for displaying images and a non-display area DD_NDA provided in at least one side of the display panel DD_DA. The non-display area DD_NDA is an area at which images is not displayed (e.g., a peripheral area of the display area DD_DA). However, embodiments according to the present invention are not limited thereto. In some embodiments, a shape of the display area DD_DA and a shape of the non-display area DD_NDA may be correspondingly designed.

In some embodiments, the first display device DD1 may include a sensing region and a non-sensing region. The first display device DD1 not only may display an image through the sensing area, but also may detect a touch input made on an image display surface (or input surface) or may detect light incident from the front. The non-sensing area may surround the sensing area, but this is merely an example, and embodiments according to the present invention are not limited thereto. In some embodiments, a partial area of the display area DD_DA may correspond to the sensing area.

The first display device DD1 may include a display panel DP and a window WD.

The display panel DP may display an image. As the display panel DP, a self-emission display panel such as an organic light emitting display panel (OLED panel) using an organic light emitting diode as a light emitting element, a nano-scale LED display panel using an ultra small light emitting diode as a light emitting element, or a quantum dot organic light emitting display panel (QD OLED panel) using a quantum dot and an organic light emitting diode may be used. In addition, as the display panel DP, a non-emission display panel such as a liquid crystal display panel (LCD panel), an electro-phoretic display panel (EPD panel), or an electro-wetting display panel (EWD panel) may be used. When a non-emission display panel is used as the display panel DP, the first display device DD1 may include a backlight unit that supplies light to the display panel DP.

The window WD for protecting an exposed surface of the display panel DP may be provided on the display panel DP. The window WD may protect the display panel DP from external impact, and may provide an input surface and/or a display surface to a user. The window WD may be combined with the display panel DP by using an optically transparent adhesive member (OCA).

The window WD may have a multi-layered structure selected from a glass substrate, a plastic film, and a plastic substrate. Such a multi-layered structure may be formed through a continuous process or an adhesive process using an adhesive layer. The window WD may be entirely or partially flexible.

A touch sensor may be arranged between the display panel DP and the window WD. The touch sensor is directly arranged on a surface of the display panel DP on which an image is displayed to receive a user's touch input. According to some embodiments of the present invention, "being directly arranged" may mean that it is formed by a continuous process, except for being attached by using a separate adhesive layer.

Meanwhile, due to the non-display area DD_NDA arranged in a boundary area between the first to fourth display devices DD1 to DD4, for example, due to a seam area, an image displayed on a screen of the multi-screen display device TDD may be cut off. Particularly, when a width (or area) of the non-display area DD_NDA is relatively large, a sense of cut-off of the image may be increased in the boundary area between the first to fourth display devices DD1 to DD4.

Meanwhile, when the width (or area) of the non-display area DD_NDA is reduced, a size of the display area DD_DA of a corresponding display device may be increased without increasing a size of each of the first to fourth display devices DD1 to DD4. Accordingly, a larger display area DD_DA may be provided. In addition, when the non-display area DD_NDA is reduced, when the multi-screen display device TDD is implemented by using the first to fourth display devices DD1 to DD4, the boundary between the first to fourth display devices DD1 to DD4 may be minimally viewed, and a more natural screen may be realized.

Figure 3B:
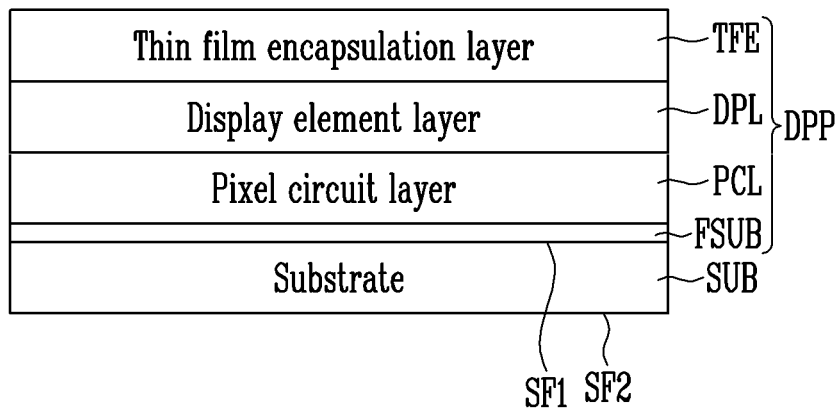
FIG. 3B illustrates a schematic cross-sectional view of a display panel according to some embodiments of the present invention.

FIG. 3A illustrates a schematic top plan view of a display panel according to some embodiments of the present invention, and FIG. 3B illustrates a schematic cross-sectional view of a display panel according to some embodiments of the present invention.

Referring to FIG. 3A and FIG. 3B, the display panel DP according to some embodiments may include a substrate SUB and a display portion DPP.

The substrate SUB may be formed of one area having an approximately rectangular shape. However, the number of areas provided in the substrate SUB may vary, and the shape of the substrate SUB may have a different shape depending on the area provided in the substrate SUB. The substrate SUB may include a first surface SF1 and a second surface SF2 facing each other.

The substrate SUB may be made of an insulating material such as glass or a resin. In addition, the substrate SUB may be made of a flexible material to be bendable or foldable, and may have a single-layered structure or a multi-layered structure. For example, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. However, the material included in the substrate SUB is not limited to the above-described embodiments.

The substrate SUB may include a display area DA and a non-display area NDA. The display area DA may be an area in which pixels PXL are provided to display an image, and the non-display area NDA may be an area in which the pixels PXL are not provided and no image is displayed. For better understanding and ease of description, only one pixel PXL is shown in FIG. 3A, but a plurality of pixels PXL may be substantially located in the display area DA of the substrate SUB.

The display area DA of the substrate SUB (or display panel DP) corresponds to the display area DD_DA of the first display device (see 'DD1' in FIG. 2A), and the non-display area NDA of the substrate SUB (or display panel DP) may correspond to the non-display area DD_NDA of the first display device DD1.

A driver for driving the pixels PXL and some of wires connecting the pixels PXL and the driver may be provided in the non-display area NDA. The non-display area NDA may correspond to a bezel area of the first display device DD1.

The pixels PXL may be provided in the display area DA of the substrate SUB. Each of the pixels PXL may be a minimum unit that displays an image. The pixels PXL may include light emitting elements that emits white light and/or color light. Each of the pixels PXL may emit one color of red, green, and blue, but is not limited thereto, and may emit a color such as cyan, magenta, or yellow. Each of the pixels PXL may include a pixel circuit layer PCL provided on the substrate SUB and a display element layer DPL provided on the pixel circuit layer PCL.

The pixels PXL may be arranged in a matrix form along a row extending in the first direction DR1 and a column extending in the second direction DR2 crossing the first direction DR1. However, the arrangement form of the pixels PXL is not particularly limited thereto, and the pixels PXL may be arranged in various forms. In the drawing, the pixels PXL are shown to have a rectangular shape, but the present invention is not limited thereto, and may be changed in various shapes. In addition, when a plurality of pixels PXL are provided, they may be provided to have different areas (or sizes). For example, in the case in which the pixels PXL have different colors of emitted light, the pixels PXL for each color may be provided in different areas (or sizes) or in different shapes.

The driver provides a signal to each of the pixels PXL through a wire portion, and controls driving of the pixels PXL. In FIG. 3A, the wire portion is omitted for better understanding and ease of description, and the wire portion will be described later with reference to FIG. 5A and FIG. 5B.

The display portion DPP may be provided on the first surface SF1 of the substrate SUB. The display portion DPP may include a flexible substrate FSUB, a pixel circuit layer PCL, a display element layer DPL, and a thin film encapsulation layer TFE.

The flexible substrate FSUB may be provided and/or formed on the first surface SF1 of the substrate SUB. The flexible substrate FSUB may be a base substrate (or base layer) of the display portion DPP. The flexible substrate FSUB may be made of flexible polyimide. However, the material included in the flexible substrate FSUB is not limited to the above-described embodiments. In some embodiments, the flexible substrate FSUB may be omitted.

The pixel circuit layer PCL may be located on the flexible substrate FSUB. A plurality of transistors and signal lines connected to the transistors may be located on the pixel circuit layer PCL. For example, each transistor may have a structure in which a semiconductor layer, a gate electrode, and a source/drain electrode are sequentially stacked with an insulation layer interposed therebetween. The semiconductor layer may include an amorphous silicon, a poly silicon, a low temperature poly silicon, and an organic semiconductor. The gate electrode and the source/drain electrode may contain one of aluminum (Al), copper (Cu), titanium (Ti), and molybdenum (Mo), but the present invention is not limited thereto. In addition, the pixel circuit layer PCL may include at least one or more of insulation layers.

The display element layer DPL may be located on the pixel circuit layer PCL. The display element layer DPL may include a light emitting element that emits light. The light emitting element may be, for example, an organic light emitting diode, but the present invention is not limited thereto. In some embodiments, the light emitting element may be an inorganic light emitting element including an inorganic light emitting material or a light emitting element (quantum dot display element) that emits light by changing a wavelength of light emitted by using a quantum dot. For example, the organic light emitting diode may have a structure in which an anode, a hole transport layer (HTL), an organic emission layer, an electron transport layer (ETL), and a cathode are sequentially stacked, but the present invention is not limited thereto.

The thin film encapsulation layer TFE may be located on the display element layer DPL. The thin film encapsulation layer TFE may be an encapsulation substrate or a multi-layered encapsulation film. When the thin film encapsulation layer TFE is in a form of the encapsulation film, it may include an inorganic film and/or an organic film. For example, the thin film encapsulation layer TFE may have a structure in which an inorganic film, an organic film, and an inorganic film are sequentially stacked. The thin film encapsulation layer TFE may prevent external air and moisture from penetrating into the display element layer DPL and the pixel circuit layer PCL.

Each pixel PXL may be provided on the first surface SF1 of the substrate SUB in addition to the flexible substrate FSUB, the pixel circuit layer PCL, the display element layer DPL, and the thin film encapsulation layer TFE.

Figure 4A:
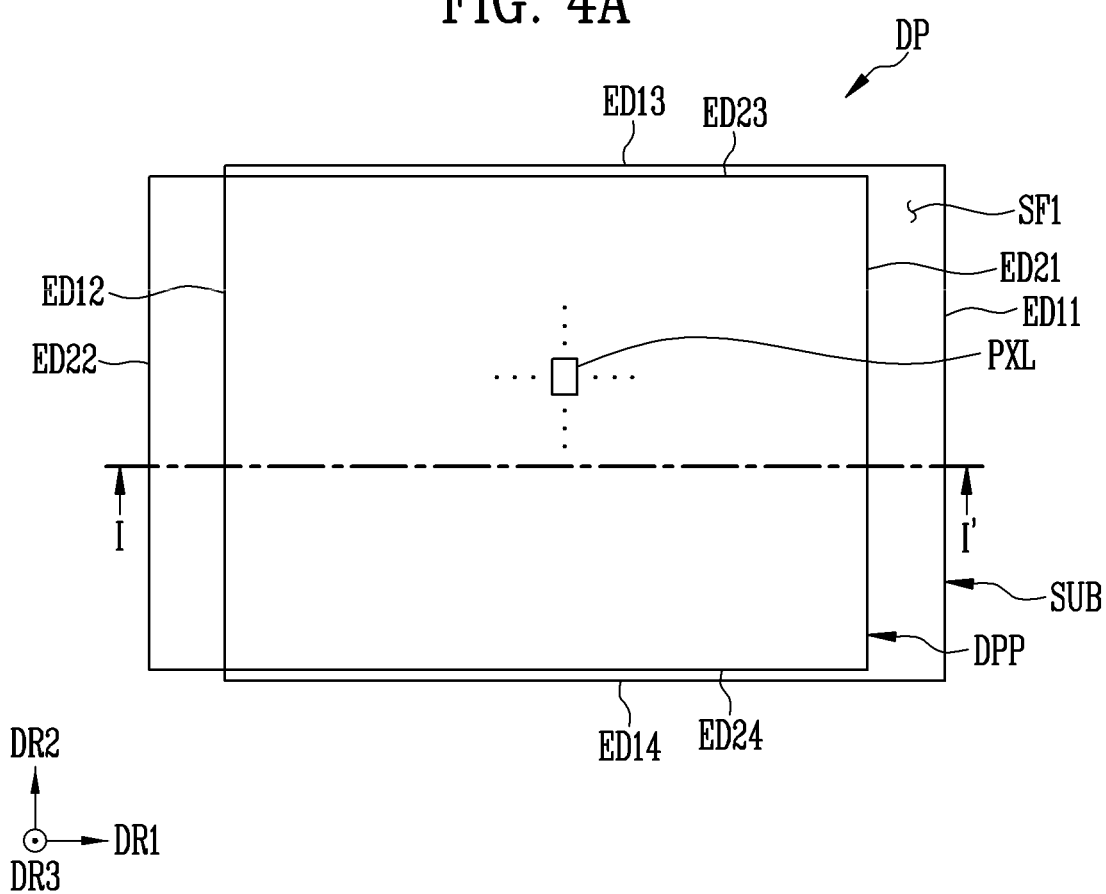
FIG. 4A illustrates a schematic top plan view of a display panel according to some embodiments of the present invention.
Figure 4B:
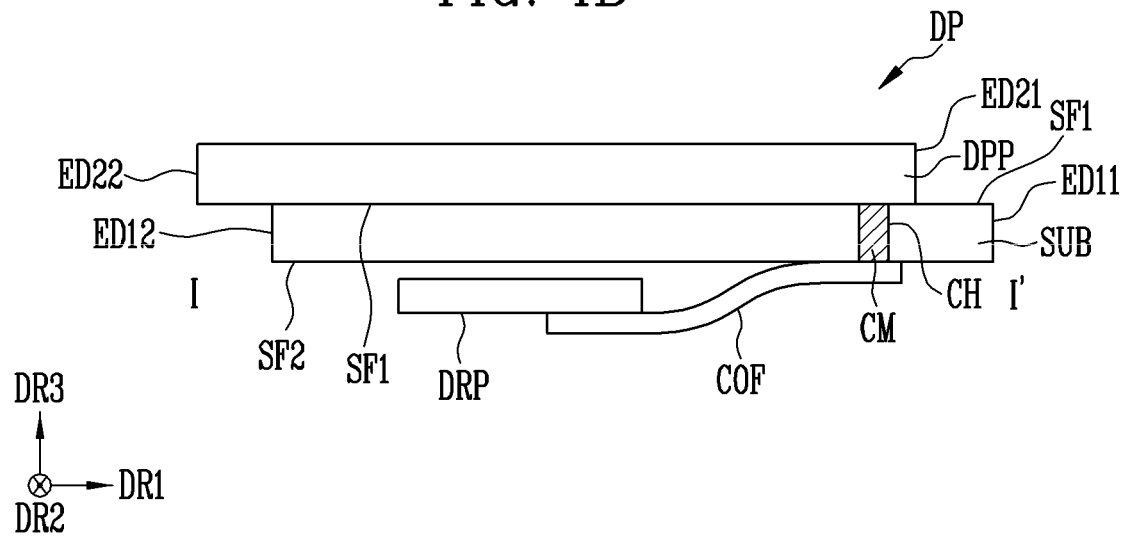
FIG. 4B illustrates a cross-sectional view taken along the line I-I' of FIG. 4A.

FIG. 4A illustrates a schematic top plan view of a display panel according to some embodiments of the present invention, and FIG. 4B illustrates a cross-sectional view taken along the line I-I' of FIG. 4A.

In FIG. 4A and FIG. 4B, a horizontal direction is indicated as the first direction DR1, a vertical direction crossing the first direction DR1 is indicated a second direction DR2, and a thickness direction of the substrate SUB is indicated as the third direction DR3. The first to third directions DR1, DR2, and DR3 may mean directions indicated by the first to third directions DR1, DR2, and DR3, respectively.

Referring to FIG. 4A and FIG. 4B, the display panel DP according to some embodiments may include the substrate SUB, the display portion DPP, and a driver DRP.

The substrate SUB may be configured to support the display portion DPP, and may include a transparent insulating material to transmit light. The substrate SUB may be a rigid substrate or a flexible substrate. The substrate SUB may have the same configuration as the substrate SUB described with reference to FIG. 3A and FIG. 3B.

The substrate SUB may include four edges ED11 to ED14. The four edges ED11 to ED14 may include a (1-1)-th edge ED11, a (1-2)-th edge ED12, a (1-3)-th edge ED13, and a (1-4)-th edge ED14.

The substrate SUB may include at least one or more of contact holes CH penetrating at least one area of the substrate SUB. For example, the substrate SUB may include a contact hole CH penetrating through the first surface SF1 and the second surface SF2. A conductive material CM may be located inside the contact hole CH. The conductive material CM directly contacts elements respectively located on the first surface SF1 and the second surface SF2 of the substrate SUB to electrically and/or physically connect elements located on the first surface SF1 and elements located on the second surface SF2. As an example, the conductive material CM may directly contact the display portion DPP located on the first surface SF1 of the substrate SUB and the driver DRP located on the second surface SF2 of the substrate SUB to electrically and/or physically connect the display portion DPP and the driver DRP.

The driver DRP may be provided on the second surface SF2 of the substrate SUB to be electrically connected to the display portion DPP through the conductive material CM described above. The driver DRP may be a printed circuit board that generates overall driving signals and power signals necessary for driving the display panel DP to provide them to the display panel DP. According to some embodiments, the driver DRP may be electrically connected to the conductive material CM through a flexible circuit film COF.

The flexible circuit film COF may be an intermediate medium that electrically connects the conductive material CM and the driver DRP. The flexible circuit film COF may process various signals inputted from the driver DRP to output them to the display panel DP. To this end, one end of the flexible circuit film COF may be electrically connected to the conductive material CM, and the other end thereof facing the first end thereof may be electrically connected to the driver DRP.

The display portion DPP may include a plurality of pixels PXL provided on the substrate SUB. The display portion DPP may be an image display area that is provided with the pixels PXL and in which an image is displayed. The image display area may correspond to a display area of the display panel DP (see 'DA' in FIG. 3A).

According to some embodiments, the display portion DPP may include four edges ED21 to ED24. The four edges ED21 to ED24 may include a (2-1)-th edge ED21, a (2-2)-th edge ED22, a (2-3)-th edge ED23, and a (2-4)-th edge ED24. The edges ED21 to ED24 of the display portion DPP may correspond to the edges ED11 to ED14 of the substrate SUB. For example, the (2-1)-th edge ED21 may correspond to the (1-1)-th edge ED11, the (2-2)-th edge ED22 may correspond to the (1-2)-th edge ED12, the (2-3)-th edge ED23 may correspond to the (1-3)-th edge ED13, the (2-4)-th edge ED24 may correspond to the (1-4)-th edge ED14.

At least one of the four edges ED11 to ED14 of the substrate SUB may further protrude in the first direction DR1 compared to the four edges ED21 to ED24 of the display portion DPP. For example, the (1-1)-th edge ED11 of the substrate SUB may further protrude in the first direction DR1 compared to the (2-1)-th edge ED21 of the display portion DPP. Accordingly, the (1-1)-th edge ED11 and the (2-1)-th edge ED21 may be spaced apart from each other at an interval (e.g., a set or predetermined interval) in the first direction DR1. In this case, the first surface SF1 may be exposed to the outside in the (1-1)-th edge ED11 of the substrate SUB.

At least one of the four edges ED21 to ED24 of the display portion DDP may further protrude in the first direction DR1 compared to the four edges ED11 to ED14 of the substrate SUB. For example, the (2-2)-th edge ED22 of the display portion DDP may further protrude in the first direction DR1 compared to the (1-2)-th edge ED12 of the substrate SUB. Accordingly, the (2-2)-th edge ED22 and the (1-2)-th edge ED12 may be spaced apart from each other at an interval (e.g., a set or predetermined interval) in the first direction DR1.

Figure 5A:
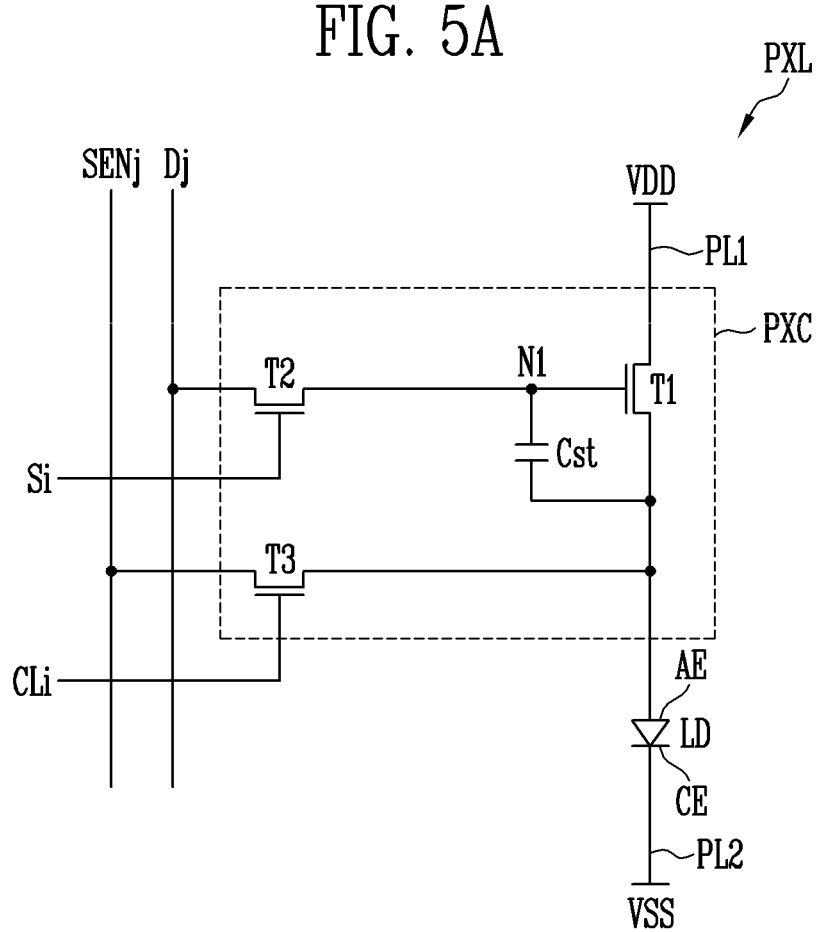
FIG. 5A and FIG. 5B illustrate circuit diagrams of an electrical connection relationship between constituent elements included in a pixel according to some embodiments of the present invention.
Figure 5B:
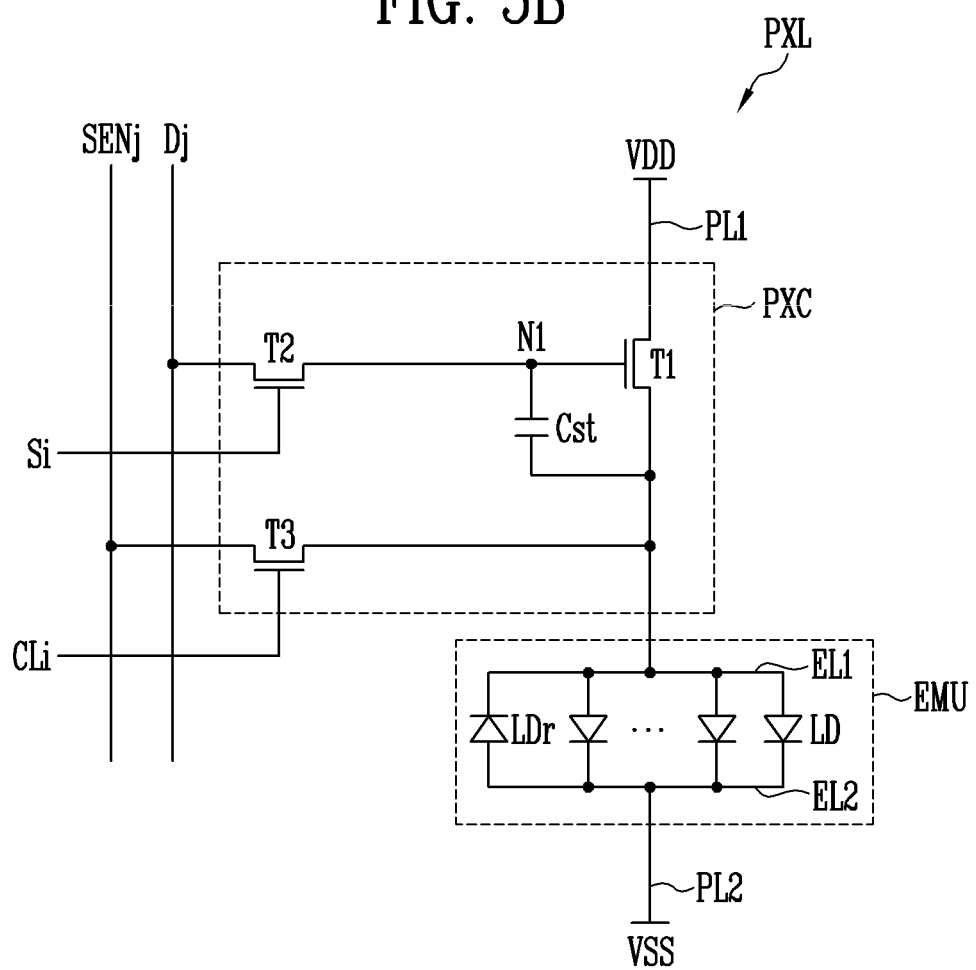

FIG. 5A and FIG. 5B illustrate circuit diagrams of an electrical connection relationship between constituent elements included in a pixel according to some embodiments of the present invention.

For example, FIG. 5A and FIG. 5B illustrate an electrical connection relationship between constituent elements included in a pixel PXL applicable to an active display device according to some embodiments. However, the types of constituent elements included in the pixel PXL to which the embodimenta of the present invention may be applied are not limited thereto.

In FIG. 5A and FIG. 5B, not only constituent elements included in the pixel but also a region in which the constituent elements are provided are comprehensively referred to as a pixel PXL.

In FIG. 5A, the pixel PXL may include an organic light emitting diode (OLED) as a light emitting element LD. In FIG. 5B, the pixel PXL may include a plurality of ultrasmall inorganic light emitting diodes as small as nano-scale to micro-scale formed in a structure in which a nitride-based semiconductor is grown as a light emitting element LD.

First, referring to FIG. 5A, the pixel PXL may include the light emitting element LD that generates luminance light corresponding to a data signal. In addition, the pixel PXL may further selectively include a pixel circuit PXC for driving the light emitting element LD.

The pixel circuit PXC may be connected to a scan line Si and a data line Dj of the pixel PXL. For example, when a pixel PXL is located in an i-th (i is a natural number) row and a j-th (j is a natural number) column of the display area, the pixel circuit PXC of the pixel PXL may be connected to an i-th scan line Si and a j-th data line Dj. In addition, the pixel circuit PXC may be connected to an i-th control line CLi and a j-th sensing line SENj of the display area. The display area may be the display area DA of the substrate SUB or of the display panel DP described with reference to FIG. 3A and FIG. 3B.

The pixel circuit PXC described above may include first to third transistors T1 to T3 and a storage capacitor Cst.

A first terminal of the first transistor T1 (driving transistor) may be connected to a first driving power source VDD through a first power line PL1, and a second terminal may be electrically connected to a first electrode AE of the light emitting element LD. A gate electrode of the first transistor T1 may be connected to a first node N1. The first transistor T1 may control an amount of driving current supplied to the light emitting element LD in response to a voltage of the first node N1.

A first terminal of the second transistor T2 (switching transistor) may be connected to the j-th data line Dj, and a second terminal thereof may be connected to the first node N1. Here, the first terminal and the second terminal of the second transistor T2 are different terminals, and for example, when the first terminal is a drain electrode, the second terminal may be a source electrode. In addition, a gate electrode of the second transistor T2 may be connected to the i-th scan line Si.

The second transistor T2 is turned on when a scan signal of a voltage capable of turning on the second transistor T2 is supplied from the i-th scan line Si to electrically connect the j-th data line Dj and the first node N1. In this case, a data signal of a corresponding frame is supplied to the j-th data line Dj, and accordingly, a data signal is transmitted to the first node N1. The data signal transmitted to the first node N1 is charged in the storage capacitor Cst.

The third transistor T3 may be connected between the first transistor T1 and the j-th sensing line SENj. For example, a first terminal of the third transistor T3 may be connected to the first terminal of the first transistor T1 connected to the first electrode AE, and a second terminal of the third transistor T3 may be connected to the j-th sensing line SENj. A gate electrode of the third transistor T3 may be connected to the i-th control line CLi. The third transistor T3 is turned on by a control signal of a gate-on voltage supplied to the i-th control line CLi during a sensing period (e.g., a set or predetermined sensing period) to electrically connect the j-th sensing line SENj to the first transistor T1.

The sensing period may be a period for extracting characteristic information (for example, a threshold voltage of the first transistor T1) of each of the pixels PXL located in the display area DA.

One electrode of the storage capacitor Cst may be connected to the first driving power supply VDD, and the other electrode may be connected to the first node N1. The storage capacitor Cst may charge a voltage corresponding to the data signal supplied to the first node N1, and may maintain the charged voltage until a data signal of a next frame is supplied.

The light emitting element LD may be an organic light emitting diode including a first electrode AE (anode), an emission layer, and a second electrode CE (cathode). The light emitting element LD may emit light of one of red, green, and blue. However, the present invention is not limited thereto. The first electrode AE of the light emitting element LD may be connected to the first transistor T1, and the second electrode CE may be connected to a second driving power source VSS through a second power line PL2. The light emitting element LD may generate light having a luminance (e.g., a set or predetermined luminance) in response to an amount of current supplied from the first transistor T1. In this case, a voltage of the first power source VDD may be set higher than that of the second power source VSS so that a current flows to the light emitting element LD.

Meanwhile, the structure of the pixel PXL is not limited to the embodiments shown in FIG. 5A. For example, a pixel circuit PXC of various structures currently known may be applied to the pixel PXL.

Hereinafter, a pixel PXL including a plurality of light emitting elements LD having a structure in which a nitride-based semiconductor is grown will be described with reference to FIG. 5B.

Referring to FIG. 5B, the pixel PXL may include a light emitting unit EMU that generates luminance light corresponding to a data signal. In addition, the pixel PXL may further selectively include a pixel circuit PXC for driving the light emitting unit EMU.

In some embodiments, the light emitting unit EMU may include a plurality of light emitting elements LD connected in parallel between the first power line PL1 to which the voltage of the first driving power source VDD is applied and the second power line PL2 to which the voltage of the second driving power source VSS is applied. For example, the light emitting unit EMU may include a first pixel electrode ELT1 (also referred to as a "first alignment electrode") connected to the first power source VDD via the pixel circuit PXC and the first power line PL1, a second pixel electrode ELT2 (also referred to as a "second alignment electrode") connected to the second power source VSS through the second power line PL2, and a plurality of light emitting elements LD connected in parallel in the same direction between the first and second pixel electrodes EL1 and ELT2. According to some embodiments, the first pixel electrode ELT1 may be an anode, and the second pixel electrode ELT2 may be a cathode.

Each of the light emitting elements LD may include first and second semiconductor layers formed of different types of semiconductor layers, and an active layer interposed therebetween. For example, each of the light emitting elements LD may be implemented as a light emitting stacked body in which a first semiconductor layer, an active layer, and a second semiconductor layer are sequentially stacked in one direction. Here, one of the first and second semiconductor layers may be an N-type semiconductor layer, and the remaining semiconductor layers may be a P-type semiconductor layer.

Each of the light emitting elements LD included in the light emitting unit EMU may include one end portion connected to the first driving power source VDD through the first pixel electrode EU and the other end portion connected to the second driving power source VSS through the second pixel electrode EL2. The first driving power source VDD and the second driving power source VSS may have different potentials. For example, the first driving power source VDD may be set as a high potential power source, and the second driving power source VSS may be set as a low potential power source. In this case, a potential difference between the first and second driving power sources VDD and VSS may be set to be equal to or higher than a threshold voltage of the light emitting elements LD during a light emitting period of the pixel PXL.

As described above, respective light emitting elements LD connected in parallel in the same direction (for example, a forward direction) between the first pixel electrode EL1 and the second pixel electrode EL2 respectively supplied with voltages of different potentials may form respective effective light source. These effective light sources may be collected to form the light emitting unit EMU of the pixel PXL.

The light emitting elements LD of the light emitting unit EMU may emit light with luminance corresponding to a driving current supplied through the corresponding pixel circuit PXC. For example, during each frame period, the pixel circuit PXC may supply a driving current corresponding to a gray value of corresponding frame data to the light emitting unit EMU. The driving current supplied to the light emitting unit EMU may be divided to flow in each of the light emitting elements LD. Therefore, while each light emitting element LD emits light with a luminance corresponding to the current flowing therein, the light emitting unit EMU may emit light having a luminance corresponding to the driving current.

In some embodiments, the light emitting unit EMU may further include at least one ineffective light source, for example, a reverse light emitting element LDr, in addition to the light emitting elements LD forming respective effective light sources. The reverse light emitting element LDr is connected in parallel between the first and second pixel electrodes EL1 and EL2 together with the light emitting devices LD forming the effective light sources, but may be connected between the first and second pixel electrodes EL1 and EL2 in the opposite direction with respect to the light emitting elements LD. The reverse light emitting element LDr maintains an inactive state even when a driving voltage (e.g., a set or predetermined driving voltage) (for example, a driving voltage in the forward direction) is applied between the first and second pixel electrodes EL1 and EL2, thus a current does not substantially flow in the reverse light emitting element.

Each light emitting unit EMU may be configured to include at least one series stage including a plurality of light emitting elements LD connected in parallel to each other. That is, the light emitting unit EMU may be configured to have a series/parallel mixed structure.

Because the pixel circuit PXC is the same as the pixel circuit PXC described with reference to FIG. 5A, a detailed description thereof will be omitted.

According to some embodiments, the structure of the pixel circuit PXC may be variously changed. For example, the pixel circuit PXC may additionally include other circuit elements such as at least one transistor element such as a transistor element for initializing the first node N1 and/or a transistor element for controlling a light emission time of the light emitting elements LD, or a boosting capacitor for boosting the voltage of the first node N1.

Figure 6B:
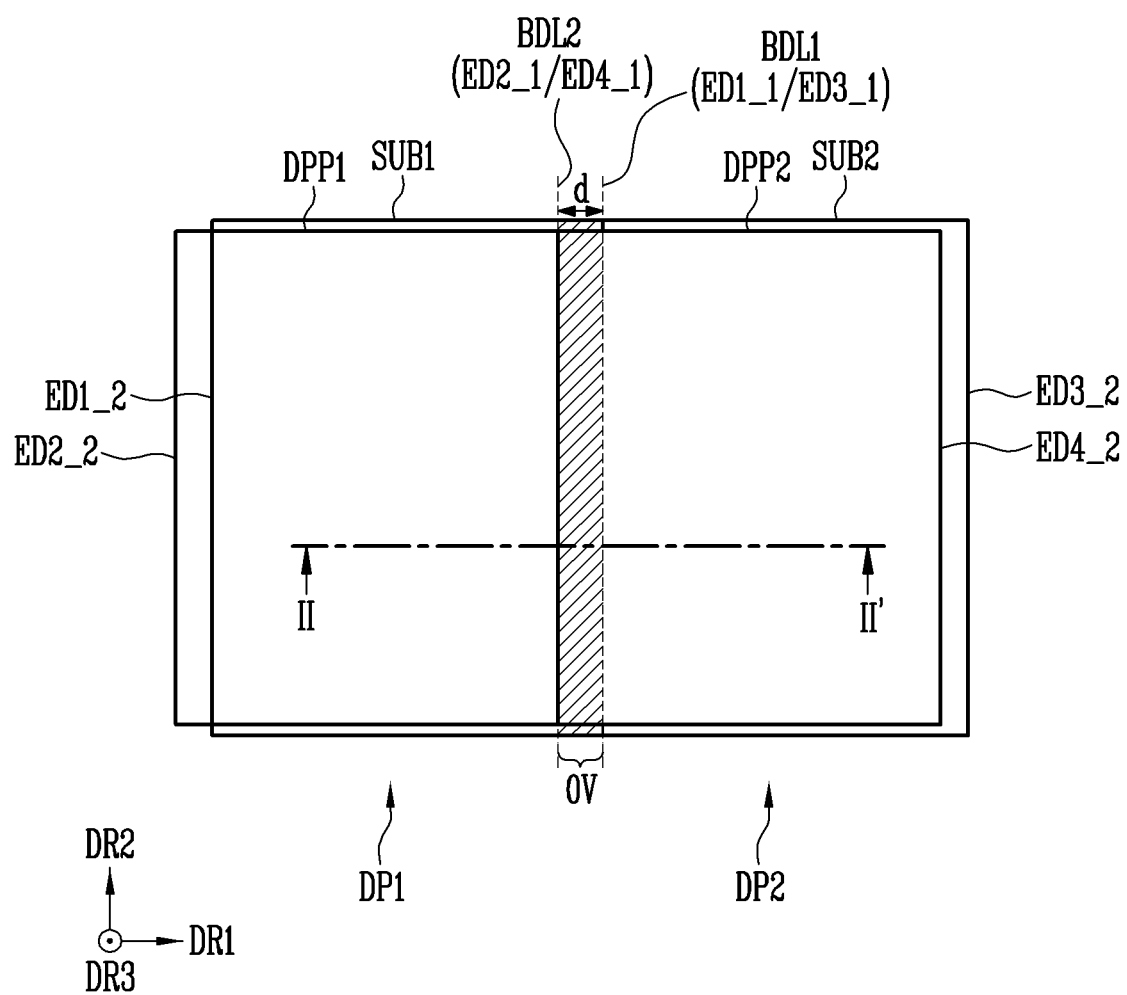

FIG. 6A and FIG. 6B illustrate schematic top plan views of a display device according to some embodiments of the present invention, FIG. 7 illustrates a cross-sectional view taken along the line II-II' of FIG. 6B, and FIG. 8 illustrates a schematic cross-sectional view of a state in which a first display panel and a second display panel of FIG. 7 are separated.

In FIG. 6A to FIG. 8, the first to third directions DR1 to DR3 may mean directions indicated by the first to third directions DR1, DR2, and DR3, respectively.

Referring to FIG. 6A to FIG. 8, the display device according to some embodiments may include a first display panel DP1 and a second display panel DP2 arranged to be adjacent to each other in the first direction DR1.

The first display panel DP1 may include a first substrate SUB1, a first display portion DPP1, and a driver DRP. In the first display panel DP1, the driver DRP may be electrically connected to the first display portion DPP1 through a conductive material CM and a flexible circuit film COF located in a contact hole CH penetrating the first substrate SUB1.

The second display panel DP2 may include a second substrate SUB2, a second display portion DPP2, and a driver DRP. In the second display panel DP2, the driver DRP may be electrically connected to the second display portion DPP2 through a conductive material CM and a flexible circuit film COF located in a contact hole CH penetrating the second substrate SUB2.

Each of the first and second substrates SUB1 and SUB2 may have the same configuration as that of the substrate SUB described with reference to FIG. 3A to FIG. 4B, and each of the first and second display portions DPP1 and DPP2 have the same configuration as that of the display portion DPP described with reference to FIG. 3A to FIG. 4B. According to some embodiments, each of the first and second substrates SUB1 and SUB2 may include a first surface SF1 and a second surface SF2 facing each other in the third direction DR3.

The first substrate SUB1 may include a (1-1)-th edge ED1_1 and a (1-2) edge ED1_2 facing each other in the first direction DR1. The first display portion DPP1 may include a (2-1)-th edge ED2_1 and a (2-2) edge ED2_2 facing each other in the first direction DR1. When viewed in a plan view, the (1-1)-th edge ED1_1 and the (2-1)-th edge ED2_1 may be arranged to be adjacent to each other, and the (1-2)-th edge ED1_2 and the (2-2)-th edge ED2_2 may be arranged to be adjacent to each other.

When viewed in a plan view and a cross-sectional view, the (1-1)-th edge ED1_1 and the (2-1)-th edge ED2_1 do not coincide with each other, and may be spaced apart from each other at a distance (e.g., a set or predetermined distance) d. For example, the (1-1)-th edge ED1_1 may be arranged to be closer to the second display panel DP2 than the (2-1)-th edge ED2_1 in the first direction DR1. In this case, the first substrate SUB1 may protrude toward the second display panel DP2 compared to the first display portion DPP1 in the first direction DR1. Accordingly, the first surface SF1 of the first substrate SUB1 corresponding to the (1-1)-th edge ED1_1 may be exposed to the outside.

When viewed in a plan view, the (1-2)-th edge ED1_2 and the (2-2)-th edge ED2_2 do not coincide with each other, and may be spaced apart from each other. For example, as shown in FIG. 6A, the (1-2)-th edge ED1_2 may be arranged to be farther from the second display panel DP2 than the (2-2)-th edge ED2_2 in the first direction DR1. However, the present invention is not limited thereto. In some embodiments, as shown in FIG. 6B, the (1-2)-th edge ED1_2 may be arranged to be further adjacent to the second display panel DP2 than the (2-2)-th edge ED2_2 in the first direction DR1. In this case, the (2-2)-th edge ED2_2 may further protrude toward the outside than the (1-2)-th edge ED1_2 in the first direction DR1. Accordingly, at least one area of the first display portion DPP1 may not overlap the first substrate SUB1. According to some embodiments, the (1-2)-th edge ED1_2 and the (2-2)-th edge ED2_2 may coincide with each other.

The second substrate SUB2 may include a (3-1)-th edge ED3_1 and a (3-2) edge ED3_2 facing each other in the first direction DR1. The second display portion DPP2 may include a (4-1)-th edge ED4_1 and a (4-2) edge ED4_2 facing each other in the first direction DR1. When viewed in a plan view, the (3-1)-th edge ED3_1 and the (4-1)-th edge ED4_1 may be arranged to be adjacent to each other, and the (3-2)-th edge ED3_2 and the (4-2)-th edge ED4_2 may be arranged to be adjacent to each other.

When viewed in a plan view and a cross-sectional view, the (3-1)-th edge ED3_1 and the (4-1)-th edge ED4_1 do not coincide with each other, and may be spaced apart from each other at a distance (e.g., a set or predetermined distance) d. For example, the (4-1)-th edge ED4_1 may be arranged to be closer to the second display panel DP1 than the (3-1)-th edge ED3_1 in the first direction DR1. In this case, the second display portion DPP2 may further protrude toward the first display panel DP1 than the second substrate SUB2 in the first direction DR1 as shown in FIG. 7 and FIG. 8.

In addition, when viewed in a plan view, the (3-2)-th edge ED3_2 and the (4-2)-th edge ED4_2 do not coincide with each other, and may be spaced apart from each other. For example, the (3-2)-th edge ED3_2 may be arranged to be farther from the first display panel DP1 than the (4-2)-th edge ED4_2 in the first direction DR1. In this case, the second substrate SUB2 may further protrude toward the outside than the second display portion DPP2 in the first direction DR1. Accordingly, at least one area of the second substrate SUB2 may not overlap the second display portion DPP2.

According to some embodiments, first and second boundary lines BDL1 and BDL2 extending in the second direction DR2 may be located between the first display panel DP1 and the second display panel DP2. The first boundary line BDL1 and the second boundary line BDL2 do not coincide with each other, and may be spaced apart from each other in the first direction DR1.

According to some embodiments, the first boundary line BDL1 may correspond to a boundary between the (1-1)-th edge ED1_1 and the (3-1)-th edge ED3_1. That is, the first boundary line BDL1 may correspond to a boundary (or bonding portion) between the first substrate SUB1 and the second substrate SUB2. In this case, the first substrate SUB1 and the second substrate SUB2 may be arranged to be adjacent in the first direction DR1 based on the first boundary line BDL1.

According to some embodiments, the second boundary line BDL2 may correspond to a boundary between the (2-1)-th edge ED2_1 and the (4-1)-th edge ED4_1. That is, the second boundary line BDL2 may correspond to a boundary (or bonding portion) between the first display portion DPP1 and the second display portion DPP2. In this case, the first display portion DPP1 and the second display portion DPP2 may be arranged to be adjacent in the first direction DR1 based on the second boundary line BDL2.

A display device, for example, a multi-screen display device, may be implemented by combining the above-described first and second display panels DP1 and DP2. In this case, some elements of the second display panel DP2 are located on some elements of the first display panel DP1, so that the first display panel DP1 and the second display panel DP2 may be combined. As an example, as shown in FIG. 8, an adhesive material ADH (or bonding material) is applied on the first surface SF1 of the first substrate SUB1 exposed at the (1-1)-th edge ED1_1, and the second display portion DPP2 protruding compared to the second substrate SUB2 is located on the adhesive material ADH, and then a multi-screen display device may be implemented by combining the first display panel DP1 and the second display panel DP2. According to some embodiments, the adhesive material ADH may include a transparent and/or opaque resin having adhesiveness (or bonding property), but the present invention is not limited thereto.

The multi-screen display device may include an overlapping area OV in which the first display panel DP1 and the second display panel DP2 partially overlap. The overlapping area OV may be an area provided by arranging the second display portion DDP2 protruding compared to the second substrate SUB2 on the first substrate SUB1 protruding compared to the first display portion DDP1 between the first display panel DP1 and the second display panel DP2.

When viewed in a plan view and a cross-sectional view, the overlapping area OV may be located between the first boundary line BDL1 and the second boundary line BDL2. In the overlapping area OV, the first substrate SUB1 and the second display portion DDP2 may partially overlap. In this case, the first boundary line BDL1 may be arranged to be closer to the second display panel DP2 than the second boundary line BDL2 in the first direction DR1 in the overlapping area OV, and the second border line BDL2 may be arranged to be closer to the first display panel DP1 than the first boundary line BDL1 in the first direction DR1 in the overlapping area OV. According to some embodiments, an area (or size) of the overlapping area OV may be equal to or larger than an area (or size) of a pixel area in which at least one pixel (see 'PXL' in FIG. 4A) included in each of the first and second display portions DPP1 and DPP2 is provided, but the present invention is not limited thereto.

The first display panel DP1 including the first substrate SUB1 and the first display portion DPP1 may be arranged to be engaged with (e.g., mechanically connected to) the second display panel DP2 including the second substrate SUB2 and the second display portion DPP2 in the first direction DR1 to implement a single multi-screen display device. As described above, as the second display portion DPP2 of the second display panel DP2 is located on at least portion of the first substrate SUB1 of the first display panel DP1, the first display portion DPP1 and the second display portion DPP2 may be continuously formed in the first direction DR1. In this case, an image may be displayed even in the overlapping area OV in which the first display portion DPP1 and the second display portion DPP2 overlap. Accordingly, a width and/or area of the non-display area between the first display panel DP1 and the second display panel DP2 may be minimized or substantially eliminated. In addition, for example, because the first boundary line BDL1 is located under the second display portion DPP2, it is possible to prevent or reduce the boundary area between the first display panel DP1 and the second display panel DP2, particularly, the seam area corresponding to the bonding portion between the first substrate SUB1 and the second substrate SUB2 from being viewed, so that a more natural image (or an image with a relatively reduced visibility of a seam between the display panels) may be displayed even in the boundary area. Accordingly, according to some embodiments of the present invention, a sense of disconnection of the image displayed on the screen of the multi-screen display device may be alleviated, and a more natural screen may be formed.

Figure 9:
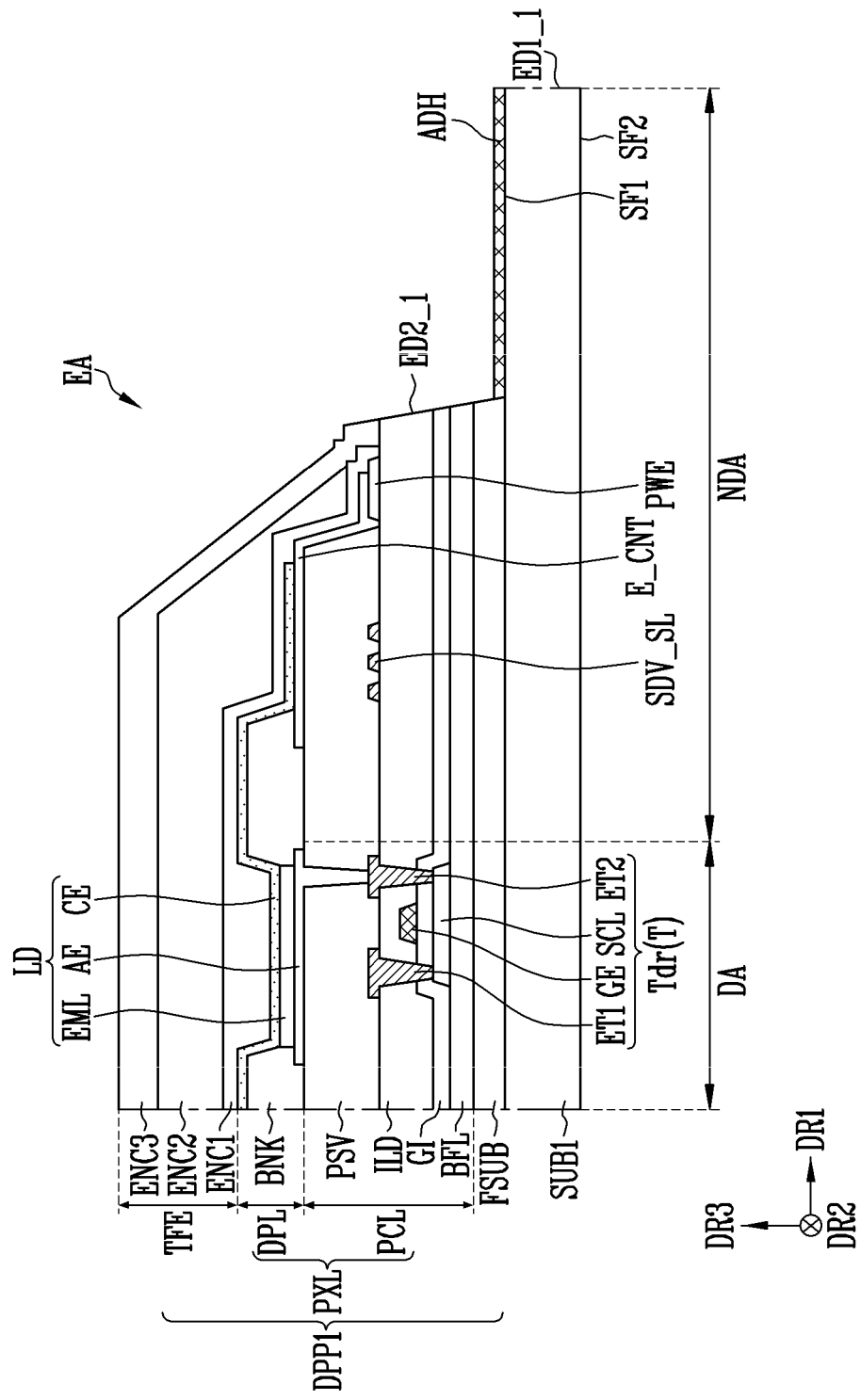
FIG. 9 to FIG. 11 illustrate schematic enlarged views of an area "EA" of FIG. 8 according to some embodiments of the present invention.
Figure 10:
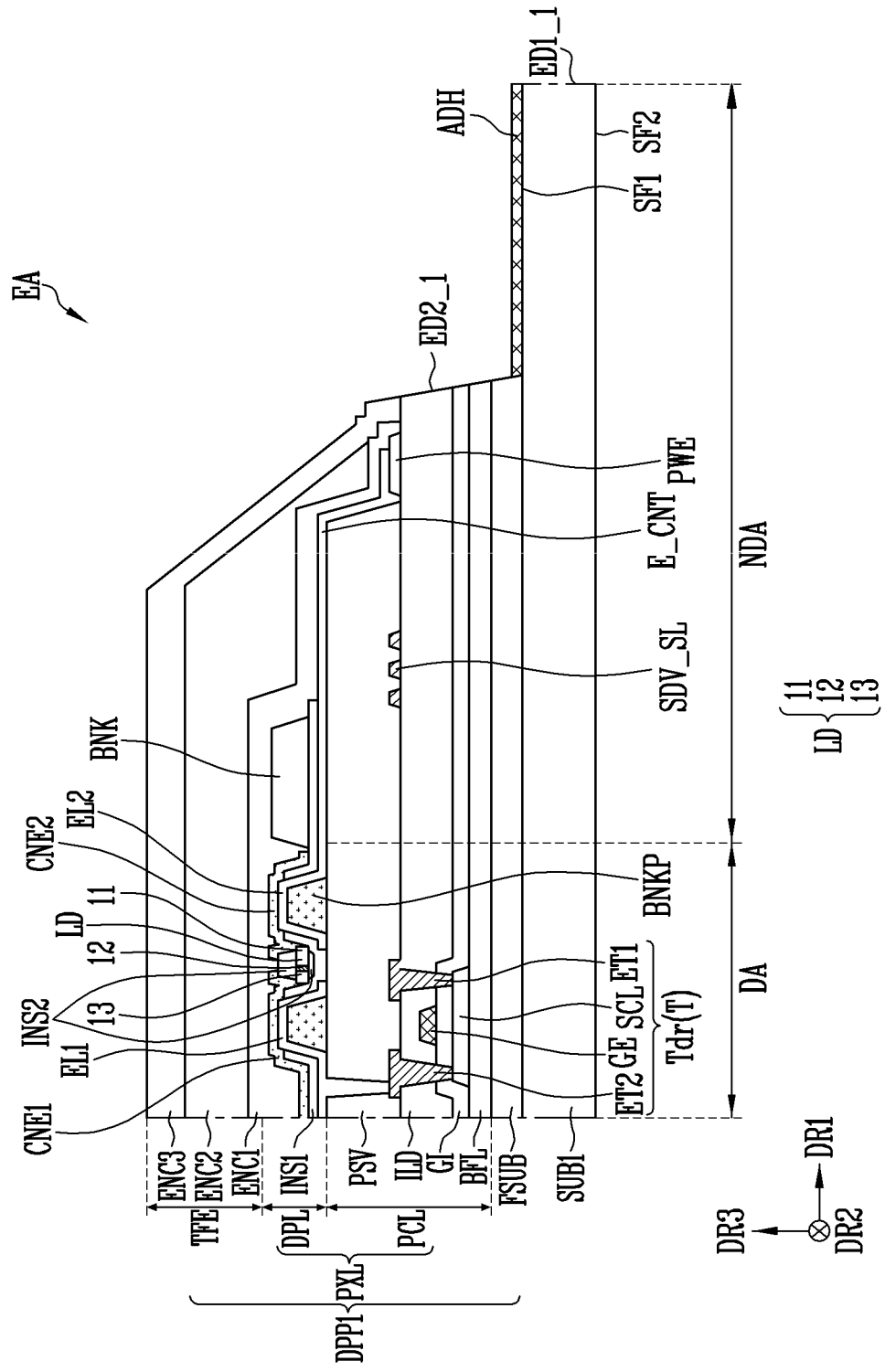
Figure 11:
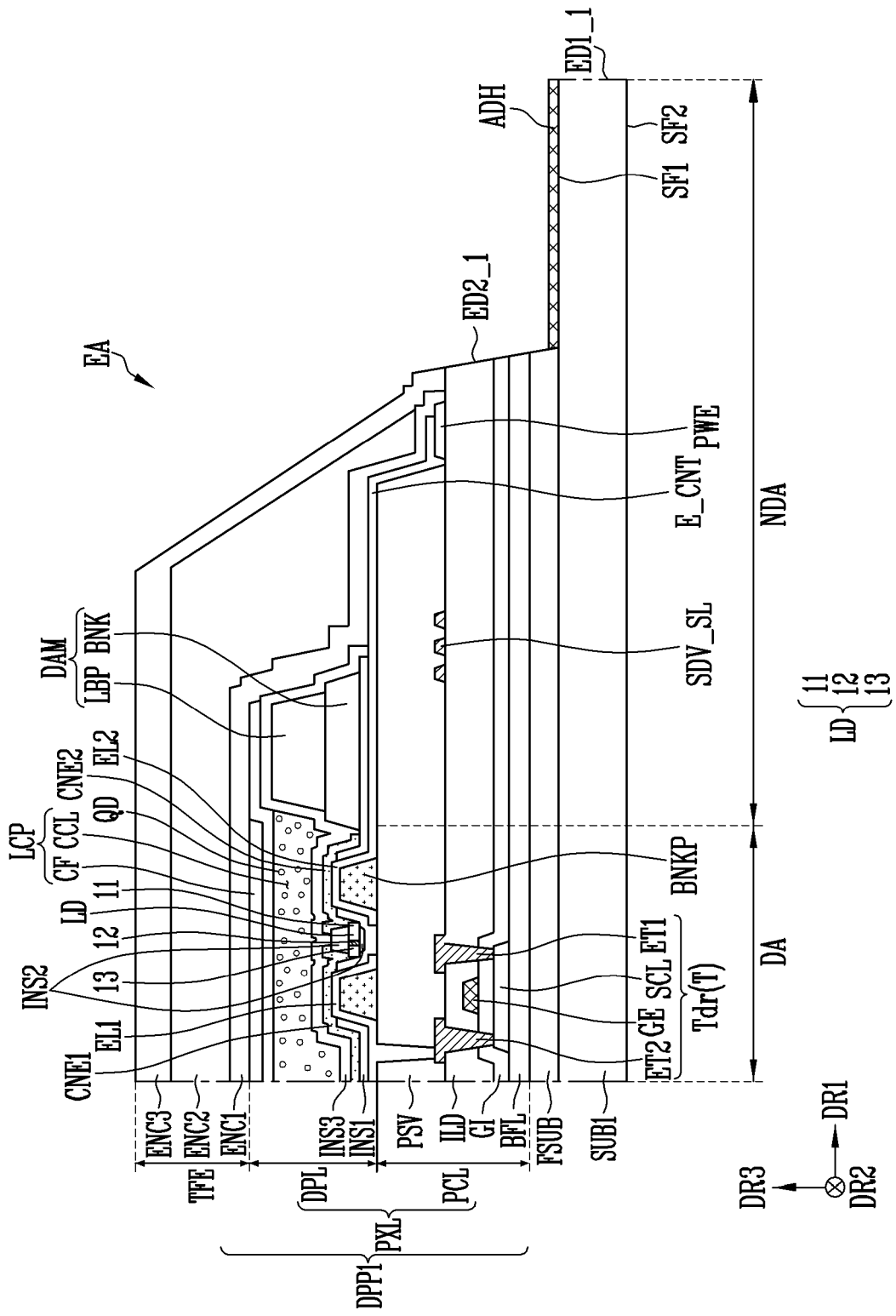

FIG. 9 to FIG. 11 illustrate schematic enlarged views of an area "EA" of FIG. 8.

In FIG. 9 to FIG. 11, the structure of the first display panel DP1 is simplified and illustrated, such as showing each electrode as only a single electrode layer and each insulation layer as only a single insulation layer, but the present invention is not limited thereto.

According to some embodiments of the present invention, "formed and/or provided in the same layer" may mean that it is formed in the same process, and "formed and/or provided in a different layer" may mean that it is formed in different processes.

In addition, according to some embodiments of the present invention, "connection" between two elements may comprehensively mean both electrical and physical connections.

Referring to FIG. 8 to FIG. 11, a first display panel DP1 may include a first substrate SUB1 and a first display portion DPP1.

The first substrate SUB1 may include a display area DA and a non-display area NDA. The first substrate SUB1 may include a first surface SF1 and a second surface SF2 facing each other in the third direction DR3.

The first display portion DPP1 may be provided on the display area DA of the first substrate SUB1 (or the first display panel DP1). The first display portion DPP1 may include a flexible substrate FSUB provided and/or formed on the first surface SF1 of the substrate SUB, at least one or more of pixels PXL, and a thin film encapsulation layer TFE. According to some embodiments, the pixel PXL may include a pixel circuit layer PCL and a display element layer DPL that are provided on the flexible substrate FSUB.

The pixel circuit layer PCL may include a buffer layer BFL, a pixel circuit (see 'PXC' in FIG. 5A and FIG. 5B) provided on the buffer layer BFL, and a passivation layer PSV provided on the pixel circuit PXC.

The buffer layer BFL may be provided and/or formed on one surface of the flexible substrate FSUB. The buffer layer BFL may prevent impurities from being diffused into the transistor T included in the pixel circuit PXC. The buffer layer BFL may include an inorganic insulation film including an inorganic material. It may include at least one of metal oxides such as a silicon nitride (SiNx), a silicon oxide (SiOx), a silicon oxynitride (SiOxNy), or an aluminum oxide (AlOx). The buffer layer BFL may be provided as a single film, but may be provided as a multifilm of at least two or more films. When the buffer layer BFL is provided as the multi-film, respective layers thereof may be made of the same material or different materials. The buffer layer BFL may be omitted depending on the material, a process condition, and the like of the substrate SUB.

The transistor T may include a driving transistor Tdr for controlling a driving current of the light emitting element LD and a switching transistors connected to the driving transistor Tdr. However, the present invention is not limited thereto, and the pixel circuit PXC may further include circuit elements that perform other functions in addition to the driving transistor Tdr and the switching transistor. According to some embodiments, the driving transistor Tdr and the switching transistor are comprehensively referred to as a transistor T or transistors T. Here, the driving transistor Tdr may have the same configuration as the first transistor T1 described with reference to FIG. 5A and FIG. 5B, and the switching transistor may have the same configuration as the second transistor T2 described with reference to FIG. 5A and FIG. 5B. The driving transistor Tdr and the switching transistor may have the substantially similar or same structure. Therefore, descriptions of the switching transistor will be replaced with descriptions of the driving transistor Tdr.

The driving transistor Tdr may include a semiconductor pattern SCL, a gate electrode GE, a first terminal ET1, and a second terminal ET2. The first terminal ET1 may be one of a source electrode and a drain electrode, and the second terminal ET2 may be the remaining electrode. For example, when the first terminal ET1 is the source electrode, the second terminal ET2 may be the drain electrode.

The semiconductor pattern SCL may be provided and/or formed on the buffer layer BFL. The semiconductor pattern SCL may include a first contact region in contact with the first terminal ET1 and a second contact region in contact with the second terminal ET2. A region that is located between the first contact region and the second contact region and overlaps the gate electrode GE may be a channel region of the driving transistor Tdr. The semiconductor pattern SCL may be a semiconductor pattern made of a poly silicon, an amorphous silicon, an oxide semiconductor, or the like. For example, the channel area, which is a semiconductor pattern that is not doped with impurities, may be an intrinsic semiconductor. The first contact region and the second contact region may be semiconductor patterns doped with impurities.

The gate electrode GE may be provided and/or formed on a gate insulation layer GI to correspond to the channel region of the semiconductor pattern SCL. The gate electrode GE may be provided on the gate insulation layer GI to overlap the channel region of the semiconductor pattern SCL. The gate electrode GE may be formed to have a single film structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double film or multi-film structure of molybdenum (Mo), titanium (Ti), copper (Cu), aluminum (Al) or silver (Ag), which are a low-resistance material.

The gate insulation layer GI may be an inorganic insulation film including an inorganic material. For example, the gate insulation layer GI may include at least one of metal oxides such as a silicon nitride (SiNx), a silicon oxide (SiOx), a silicon oxynitride (SiOxNy), or an aluminum oxide (AlOx). However, the material of the gate insulation layer GI is not limited to the above-described embodiments. In some embodiments, the gate insulation layer GI may be formed as an organic insulation film including an organic material. The gate insulation layer GI may be provided as a single film, and may be provided as a multi-film of at least two or more layers.

Each of the first terminal ET1 and the second terminal ET2 may be provided and/or formed on an interlayer insulation layer ILD, and may contact the first contact region and the second contact region of the semiconductor pattern SCL through a contact hole sequentially passing through the gate insulation layer GI and the interlayer insulation layer ILD. For example, the first terminal ET1 may contact the first contact region of the semiconductor pattern SCL, and the second terminal ET2 may contact the second contact region of the semiconductor pattern SCL. Each of the first and second terminals ET1 and ET2 may include the same material as that of the gate electrode GE, or may include one or more materials selected from the materials illustrated as constituent materials of the gate electrode GE.

The interlayer insulation layer ILD1 may include the same material as that of the gate insulation layer GI, or may include one or more materials selected from the materials illustrated as constituent materials of the gate insulation layer GI. The interlayer insulation layer ILD may be provided as a single film, and may be provided as a multi-film of at least two or more layers.

According to some embodiments, it is described that the first and second terminals ET1 and ET2 of the transistor T are separate electrodes that are electrically connected to the semiconductor pattern SCL through the contact hole sequentially penetrating the gate insulation layer GI and the interlayer insulation layer ILD, but the present invention is not limited thereto. In some embodiments, the first terminal ET1 of the transistor T may be a first contact region adjacent to the channel region of the corresponding semiconductor pattern SCL, and the second terminal ET2 of the transistor T may be a second contact region adjacent to the channel region of the corresponding semiconductor pattern SCL. In this case, the second terminal ET2 of the transistor T may be electrically connected to the light emitting elements LD of the corresponding pixel PXL through a separate connection member such as a bridge electrode.

According to some embodiments of the present invention, the transistors T may be configured as a low temperature polycrystalline silicon thin film transistor (LTPS TFT), but the present invention is not limited thereto. In some embodiments, the transistors T may be configured as an oxide semiconductor thin film transistor. In addition, according to some embodiments, the case in which the transistors T are thin film transistors having a top gate structure is described as an example, but the present invention is not limited thereto, and the structure of the transistors T may be variously changed.

A passivation layer PSV may be provided and/or formed on the pixel circuit PXC including the driving transistor Tdr.

The passivation layer PSV may include an organic insulation film, an inorganic insulation film, or the organic insulation layer located on the inorganic insulation film. The inorganic insulation film may include, for example, at least one of metal oxides such as a silicon nitride (SiNx), a silicon oxide (SiOx), a silicon oxynitride (SiOxNy), or an aluminum oxide (AlOx). The organic insulation film may be, for example, at least one of a polyacrylates resin, an epoxy resin, a phenolic resin, a polyamides resin, a polyimides rein, an unsaturated polyesters resin, a poly-phenylen ethers resin, a poly-phenylene sulfides resin, or benzocyclobutene resin.

The passivation layer PSV may be partially opened to expose a portion of the second terminal ET2 of the driving transistor Tdr.

The display element layer DPL may be provided and/or formed on the passivation layer PSV.

The display element layer DPL may include the light emitting element LD that is provided on the passivation layer PSV and emits light. The light emitting element LD may include the first and second electrodes AE and CE, and an emission layer EML provided between the two electrodes AE and CE. In this case, one of the first and second electrodes AE and CE may be an anode, and the other thereof may be a cathode. When the light emitting element LD is a top light emitting type of organic light emitting diode, the first electrode AE may be a reflective electrode, and the second electrode CE may be a transmissive electrode. According to some embodiments, a case in which the light emitting element LD is the top light emitting type of organic light emitting diode and the first electrode AE is the anode will be described as an example.

The first electrode AE may be electrically connected to the second terminal ET2 of the driving transistor Tdr through a contact hole penetrating the passivation layer PSV. The first electrode AE may include a reflective film capable of reflecting light or a transparent conductive film located above or below the reflective film. For example, the first electrode AE may be formed as a multi-film including a lower transparent conductive film made of an indium tin oxide (ITO), a reflective film provided on the lower transparent conductive film and made of Ag, and an upper transparent conductive film provided on the reflective film and made of an indium tin oxide (ITO). At least one of the transparent conductive film or the reflective film may be electrically connected to the second terminal ET2 of the driving transistor Tdr.

The display element layer DPL may further include a bank BNK provided with an opening exposing a portion of the first electrode AE, for example, an upper surface of the first electrode AE. The bank BNK may have a structure that defines (or partitions) a pixel area or light emitting area of each of the pixel PXL and a pixel adjacent thereto, and for example, it may be a pixel defining film. The bank BNK may include an inorganic insulation film including an inorganic material or an organic insulation film including an organic material. For example, the bank BNK may be formed as an organic insulation film made of an acrylic resin, an epoxy resin, a phenolic resin, a polyamide resin, a polyimide resin, or the like. However, the material of the bank BNK is not limited to the above-described examples.

The emission layer EML may be located in an area corresponding to the opening of the bank BNK. For example, the emission layer EML may be located on one surface of the exposed first electrode AE. The emission layer EML may have a multi-layered thin film structure including at least a light generation layer. The emission layer EML may include a hole injection layer for injecting holes, a hole transport layer for increasing chance of recombination between holes and electrons by having excellent hole transport and blocking movement of electrons that are not be combined in a light generation layer, a light generation layer that emits light by recombination of injected electrons and holes, a hole blocking layer for blocking movement of holes that are not be combined in a light generation layer, an electron transport layer for smoothly transporting electrons to the light generation layer, and an electron injection layer for injecting electrons.

A color of light generated by the light generation layer may be one of red, green, blue, and white, but is not limited thereto. For example, the color of light generated by the light generation layer of the emission layer EML may be one of magenta, cyan, and yellow. The hole injection layer, the hole transport layer, the hole blocking layer, the electron transport layer, and the electron injection layer may be a common film connected in light emitting areas adjacent to each other.

The second electrode CE may be provided and/or formed on the emission layer EML.

The second electrode CE may be a common film commonly provided in the pixel PXL and the pixel adjacent thereto, but the present invention is not limited thereto. The second electrode CE is a transmissive electrode, and may include a transparent conductive material (or substance). The transparent conductive material (or substance) may include a conductive oxide such as an indium tin oxide (ITO), an indium zinc oxide (IZO), a zinc oxide (ZnO), an indium gallium zinc oxide (IGZO), and an indium tin zinc oxide (ITZO), and a conductive polymer such as poly(3,4-ethylenedioxythiophene) (PEDOT).

The thin film encapsulation layer TFE may be provided and/or formed on the second electrode CE.

The thin film encapsulation layer TFE may be formed as a single film, and it may be formed as a multi-film. The thin film encapsulation layer TFE may include a plurality of insulation films covering the light emitting element LD. Specifically, the thin film encapsulation layer TFE may include at least one inorganic film and at least one organic film. For example, the thin film encapsulation layer layer TFE may have a structure in which an inorganic film and an organic film are alternately stacked. In some embodiments, the thin film encapsulation layer TFE may be an encapsulation substrate that is located on the light emitting element LD and bonded to the substrate SUB through a sealant.

The thin film encapsulation layer TFE may include first to third encapsulation layers ENC1 to ENC3. The first encapsulation layer ENC1 is provided and/or formed on the display element layer DPL, and may be arranged to overlap at least a portion of the display area DA and the non-display area NDA. The second encapsulation layer ENC2 is provided and/or formed on the first encapsulation layer ENC1, and may be arranged to overlap at least a portion of the display area DA and the non-display area NDA. The third encapsulation layer ENC3 is provided and/or formed on the second encapsulation layer ENC2, and may be arranged to overlap at least a portion of the display area DA and the non-display area NDA. In some embodiments, the third encapsulation layer ENC3 may be arranged to entirely overlap the display area DA and the non-display area NDA. According to some embodiments of the present invention, the first and third encapsulation layers ENC1 and ENC3 may be formed of an inorganic film including an inorganic material, and the second encapsulation layer ENC2 may be formed of an organic layer including an organic material.

According to some embodiments, it has been described as an example that the display element layer DPL includes the light emitting element LD configured of a top emission type organic light emitting diode including the first electrode AE, the emission layer EML, and the second electrode CE, but the present invention is not limited thereto.

In some embodiments, as shown in FIG. 10, the display element layer DPL may include at least one or more of ultra-small inorganic light emitting elements LD (or, light emitting diodes) as small as nano-scale to micro-scale formed in a structure in which a nitride-based semiconductor is grown. In this case, the display element layer DPL may include a bank pattern BNKP, the bank BNK, the first and second pixel electrodes EL1 and EL2, first and second contact electrodes CNE1 and CNE2, and first and second insulation layers INS1 and INS2. Here, the light emitting element LD may have the same configuration as each light emitting element LD described with reference to FIG. 5B, and may replace each of a plurality of light emitting elements LD.

The bank pattern BNKP may be provided and/or formed on the passivation layer PSV, and may be located in a light emitting region in which light is emitted from the pixel PXL. The bank pattern BNKP may support each of the second pixel electrodes EL1 and EL2 for changing a surface profile (or shape) of each of the first and second pixel electrodes EL1 and EL2 so as to guide the light emitted from the light emitting element LD in an image display direction of the first display panel DP1. The bank pattern BNKP may include an inorganic insulation film including an inorganic material or an organic insulation film including an organic material.

In some embodiments, the bank pattern BNKP may include an organic insulation film of a single film and/or an inorganic insulation film of a single layer, but the present invention is not limited thereto. In some embodiments, the bank pattern BNKP may be provided in a multi-layered structure in which at least one or more of organic insulation film and at least one or more of inorganic insulation film are stacked. However, the material of the bank pattern BNKP is not limited to the above-described example, and in some embodiments, the bank pattern BNKP may include a conductive material. According to some embodiments, the bank pattern BNKP may include a transparent material (or material). The transparent material may include, for example, a polyamides resin, a polyimide resin, and the like, but the present invention is not limited thereto.

The bank BNK may surround at least one side of a peripheral area (for example, a non-light emitting area in which light is not emitted) of the pixel PXL. The bank BNK may be a pixel defining film or a dam structure defining a light emitting area in which the light emitting element LD is to be supplied in a process of supplying the light emitting element LD to the pixel PXL. For example, as the light emitting area of the pixel PXL is partitioned by the bank BNK, a mixed solution (for example, ink) including a target amount and/or type of light emitting element LD may be supplied to (or injected into) the light emitting area. The bank BNK may be configured to include at least one light blocking material and/or reflective material to prevent a light leakage defect in which light leaks between the pixel PXL and pixels adjacent thereto. In some embodiments, the bank BNK may include a transparent material (or substance). The transparent material may include, for example, a polyamides resin, a polyimide resin, and the like, but the present invention is not limited thereto. According to some embodiments, a reflective material layer may be separately provided and/or formed on the bank BNK to further improve an efficiency of light emitted from the pixel PXL.

According to some embodiments, the bank BNK may have the same configuration as the bank BNK described with reference to FIG. 9.

Each of the first and second pixel electrodes EL1 and EL2 may be provided and/or formed on the bank pattern BNKP to have a surface profile corresponding to a shape of the bank pattern BNKP. Each of the first and second pixel electrodes EL1 and EL2 may be made of a material having a constant reflectance in order to direct the light emitted by the light emitting element LD in the image display direction of the first display panel DP1. For example, each of the first pixel electrode EL1 and the second pixel electrode EL2 may be made of a conductive material (or substance) having a constant reflectance. The conductive material (or substance) may include an opaque metal that is advantageous for reflecting light emitted by the light emitting elements LD in the image display direction of the first display panel DP1. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. In some embodiments, each of the first pixel electrode EL1 and the second pixel electrode EL2 may include a transparent conductive material (or substance). When the first pixel electrode EL1 and the second pixel electrode EL2 contain a transparent conductive material (or substance), a separate conductive layer of made of an opaque metal for reflecting the light emitted from the light emitting element LD in the image display direction of the first display panel DP1 may be added. However, the materials of the first pixel electrode EU and the second pixel electrode EL2 are not limited to the above materials.

In addition, each of the first pixel electrode EL1 and the second pixel electrode EL2 may be provided and/or formed as a single film, but the present invention is not limited thereto. In some embodiments, each of the first pixel electrode EL1 and the second pixel electrode EL2 may be provided and/or formed as a multifilm in which at least two or more materials of metals, alloys, conductive oxides, and conductive polymers are stacked. Each of the first pixel electrode EL1 and the second pixel electrode EL2 may be formed of a multi-layered film of at least a double-layered film or more to minimize distortion caused by signal delay when transmitting a signal (or voltage) to respective end portions of the light emitting element LD.

The first pixel electrode EL1 may be electrically connected to the second terminal ET2 of the driving transistor Tdr through the contact hole penetrating the passivation layer PSV, and the second pixel electrode EL2 may electrically and/or physically connected to a connection electrode E_CNT located in the non-display area NDA. The first pixel electrode EL1 may be an anode, and the second pixel electrode EL2 may be a cathode. According to some embodiments of the present invention, the first pixel electrode EL1 may have a configuration corresponding to the first electrode AE described with reference to FIG. 9, and the second pixel electrode EL2 may have a configuration corresponding to the second electrode CE described with reference to FIG. 9.

The light emitting element LD may be located between the first pixel electrode EL1 and the second pixel electrode EL2, and may be electrically connected to the first and second pixel electrodes EL1 and EL2, respectively. The light emitting element LD may emit one of color light and/or white light. The light emitting element LD may be provided in a form sprayed into a mixed solution to be injected into the pixel PXL. The light emitting element LD may include a light emitting stacked pattern in which a first semiconductor layer 11, an active layer 12, and a second semiconductor layer 13 are sequentially stacked in one direction, for example, in the first direction DR1. In addition, the light emitting element LD may include an insulating film surrounding an external circumferential surface of the light emitting stacked pattern.

According to some embodiments, the first semiconductor layer 11 may include at least one N-type semiconductor layer. For example, the first semiconductor layer 11 may include a semiconductor material of one of InAlGaN, GaN, AlGaN, InGaN, AlN, and InN, and may be a n-type semiconductor layer doped with a first conductive dopant (or n-type dopant) such as Si, Ge, Sn, or the like. The active layer 12 is located on the first semiconductor layer 11, and may be formed to have a single or multi-quantum well (MQW) structure. The second semiconductor layer 13 is located on the active layer 12, and may include a semiconductor layer of a type different from that of the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, and InN, and may include a p-type semiconductor layer doped with a second conductive dopant (or p-type dopant) such as Mg.

The light emitting element LD may be provided and/or formed on the first insulation layer INS1. The first insulation layer INS1 may be provided and/or formed between each of the first and second pixel electrodes EL1 and EL2 and the passivation layer PSV. The first insulation layer INS1 may stably support the light emitting element LD by filling a space between the light emitting element LD and the passivation layer PSV. The first insulation layer INS1 may include an inorganic insulation film made of an inorganic material or an organic insulation film made of an organic material.

The second insulation layer INS2 may be provided and/or formed on the light emitting element LD. The second insulation layer INS2 may be provided and/or formed on the light emitting element LD to cover a portion of an upper surface of the light emitting element LD, and may exposes respective end portions of the light emitting element LD to the outside. The second insulation layer INS2 may further fix the light emitting element LD. When there is a gap (or space) between the first insulation layer INS1 and the light emitting element LD before the second insulation layer INS2 is formed, the gap may be filled with the second insulation layer INS2.

The first contact electrode CNE1 for electrically and/or physically stably connecting the first pixel electrode EL1 and one of respective end portions of the light emitting element LD may be provided and/or formed on the first pixel electrode EL1. The second contact electrode CNE2 for electrically and/or physically stably connecting the second pixel electrode EL2 and th other of respective end portions of the light emitting element LD may be provided and/or formed on the second pixel electrode EL2. The first and second contact electrodes CNE1 and CNE2 may be made of various transparent conductive materials so that the light that is emitted from the light emitting element LD and reflected by the first and second pixel electrodes EL1 and EL2 proceeds in the image display direction of the first display panel DP1 without loss.

In some embodiments, as shown in FIG. 11, the display element layer DPL may further include a light conversion pattern layer LCP located on the first and second contact electrodes CNE1 and CNE2, with a third insulation layer INS3 interposed therebetween.

The third insulation layer INS3 may be an inorganic insulation film including an inorganic material or an organic insulation film including an organic material. For example, the third insulation layer INS3 may have a structure in which at least one inorganic insulation film and at least one organic insulation film are alternately stacked. The third insulation layer INS3 may entirely cover the display element layer DPL to block moisture or moisture from the outside from being introduced into the display element layer DPL including the light emitting elements LD. According to some embodiments, the third insulation layer INS3 may be omitted.

The light conversion pattern layer LCP is provided and/or formed on the third insulation layer INS3, and may include a color conversion layer CCL and a color filter CF corresponding to a color (e.g., a set or predetermined color).

The color conversion layer CCL may include color conversion particles QD corresponding to a specific color. The color conversion layer CCL may include color conversion particles QD that convert light emitted from the light emitting element LD located in the pixel area of the pixel PXL into light of a specific color. For example, when the pixel PXL is a red pixel (or red sub-pixel), the color conversion layer CCL may include the color conversion particles QD of a red quantum dot that converts light emitted from the light emitting element LD into red light. As another example, when the pixel PXL is a green pixel (or green sub-pixel), the color conversion layer CCL may include the color conversion particles QD of a green quantum dot that converts light emitted from the light emitting element LD into green light. As another example, when the pixel PXL is a blue pixel (or blue sub-pixel), the color conversion layer CCL may include the color conversion particles QD of a blue quantum dot that converts light emitted from the light emitting element LD into blue light. In some embodiments, when the pixel PXL is a blue pixel (or a blue sub-pixel), a light scattering layer including light scattering particles may be provided instead of the color conversion layer CCL including the color conversion particles QD. For example, when the light emitting element LD emits blue light, the pixel PXL may include the light scattering layer including the light scattering particles. The above-described light scattering layer may be omitted according to embodiments. According to some embodiments, when the pixel PXL is the blue pixel (or blue sub-pixel), a transparent polymer may be provided instead of the color conversion layer CCL.

The color filter CF may selectively transmit the light of the specific color. The color filter CF may include a color filter material that selectively transmits light of a specific color converted by the color conversion layer CCL. The color filter CF may include a red color filter, a green color filter, and a blue color filter. The above-described color filter CF may be provided in the pixel area of the pixel PXL so as to correspond to the color conversion layer CCL.

The light conversion pattern layer LCP including the color conversion layer CCL and the color filter CF may be located in the light emitting area of the pixel PXL. Particularly, the light conversion pattern layer LCP may be provided in a form that fills a space surrounded by a dam portion DAM located in a peripheral area of the pixel PXL. The space is a portion of a pixel area in which the pixel PXL surrounded by the dam portion DAM is provided, and may correspond to a light emitting area in which light is emitted from the pixel area PXA.

The dam portion DAM may be implemented by the bank BNK and a light blocking pattern LBP.

The light blocking pattern LBP is provided on the bank BNK, and may include a light blocking material preventing light leakage defects in which light leaks between the pixel PXL and pixels adjacent thereto. In addition, the light blocking pattern LBP may prevent a mixture of light respectively emitted from the pixel PXL and the pixels adjacent thereto. For example, the light blocking pattern LBP may be a black matrix.

Meanwhile, as shown in FIG. to FIG. 11, some constituent elements included in the first display portion DPP1 may be located in the non-display area NDA. For example, some constituent elements of the pixel circuit layer PCL, some constituent elements of the display element layer DPL, and the thin film encapsulation layer TFE may be located in the non-display area NDA.

A wire portion included in the pixel circuit layer PCL may be located in the non-display area NDA. The wire portion may include signal lines SDV_SL that electrically connect the driver DRP located on the second surface SF2 of the first substrate SUB1 and the pixel PXL located in the display area DA. According to some embodiments, the signal lines SDV_SL may be fanout lines. Although not directly shown in the drawings, the signal lines SDV_SL described above may be electrically connected to the conductive material CM located in the contact hole CH penetrating the first substrate SUB1 to electrically connect the driver DRP and the pixel PXL.

In addition, the non-display area NDA may include a power electrode PWE and a connection electrode E_CNT of the first substrate SUB1.

Although not directly shown in the drawings, the power electrode PWE may be electrically connected to the conductive material CM located in the contact hole CH penetrating the first substrate SUB1 to receive a second driving power source (see 'VSS' in FIG. 5A and FIG. 5B) from the driver DRP.

The connection electrode E_CNT may electrically connect the power electrode PWE and the second electrode CE of the light emitting element LD as shown in FIG. 9, or may electrically connect the power electrode PWE and the second pixel electrode EL2 of the emitting element LD as shown in FIG. 10 and FIG. 11.

As described above, the first display portion DPP1 including the flexible substrate FSUB, the pixel circuit layer PCL, the display element layer DPL, and the thin film encapsulation layer TFE may be partially removed in the non-display area NDA. Accordingly, the first surface SF1 of the first substrate SUB1 may be exposed in the non-display area NDA. In this case, the (2-1)-th edge ED2_1 of the first display portion DPP1 may be located at an inner side compared to the (1-1)-th edge ED1_1 of the first substrate SUB1 in the first direction DR1. That is, the (1-1)-th edge ED1_1 of the first substrate SUB1 may further protrude toward the second display panel DP2 compared to the (2-1)-th edge ED2_1 of the first display portion DPP1 in the first direction DR1.

The adhesive material ADH (or bonding material) may be located on the first surface SF1 of the exposed first substrate SUB1. The second display portion DPP2 protruding compared to the second substrate SUB2 may be located on the adhesive material ADH.

When the second display portion DPP2 of the second display panel DP2 is located on the first surface SF1 of the exposed first substrate SUB1, the first display portion DPP1 and the second display portion DPP2 are continuously arranged in the first direction DR1, so that a width and/or area of the non-display area NDA between the first display panel DP1 and the second display panel DP2 may be reduced.

Figure 13A:
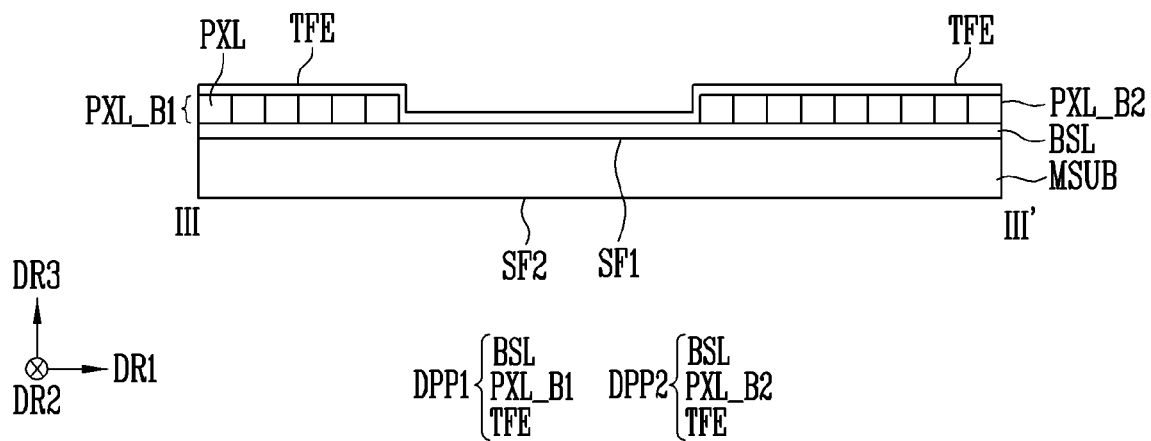
FIG. 13A illustrates a cross-sectional view taken along the line III-III' of FIG. 12A.
Figure 13B:
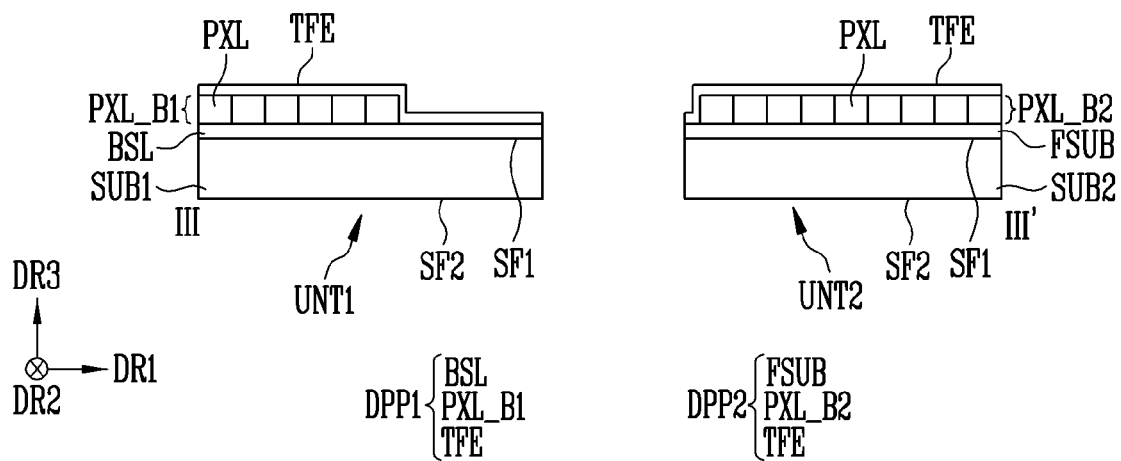
FIG. 13B illustrates a cross-sectional view taken along the line III-III' of FIG. 12B.
Figure 13C:
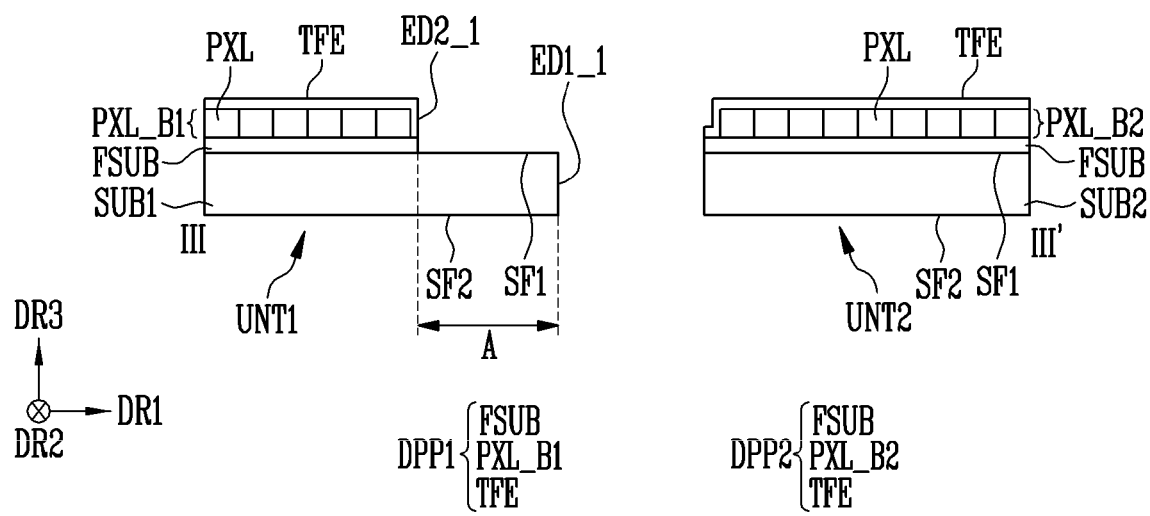
FIG. 13C illustrates a cross-sectional view taken along the line III-III' of FIG. 12C.
Figure 13D:
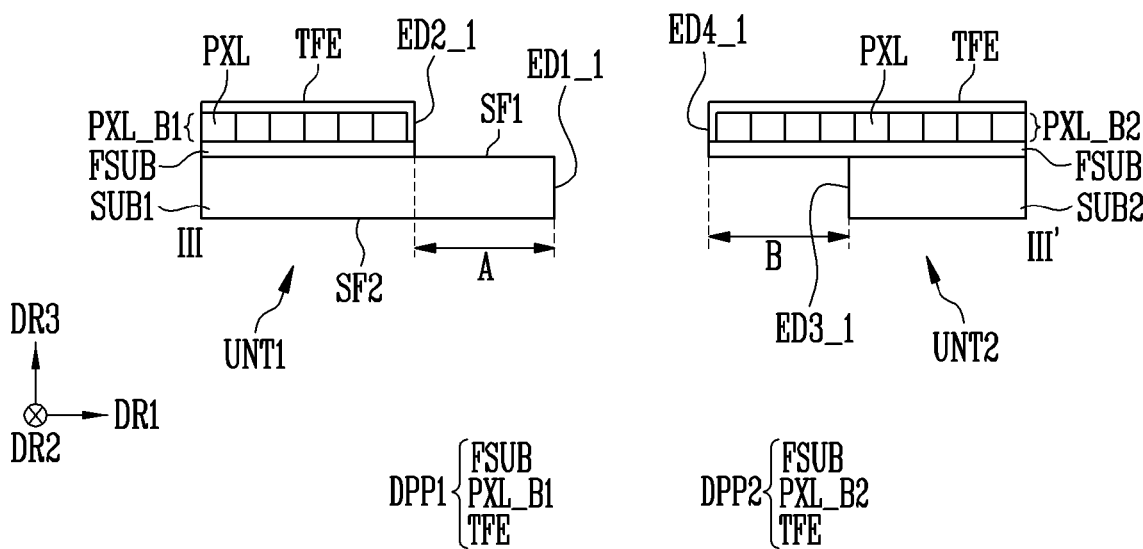
FIG. 13D illustrates a cross-sectional view taken along the line III-III' of FIG. 12D.
Figure 13E:
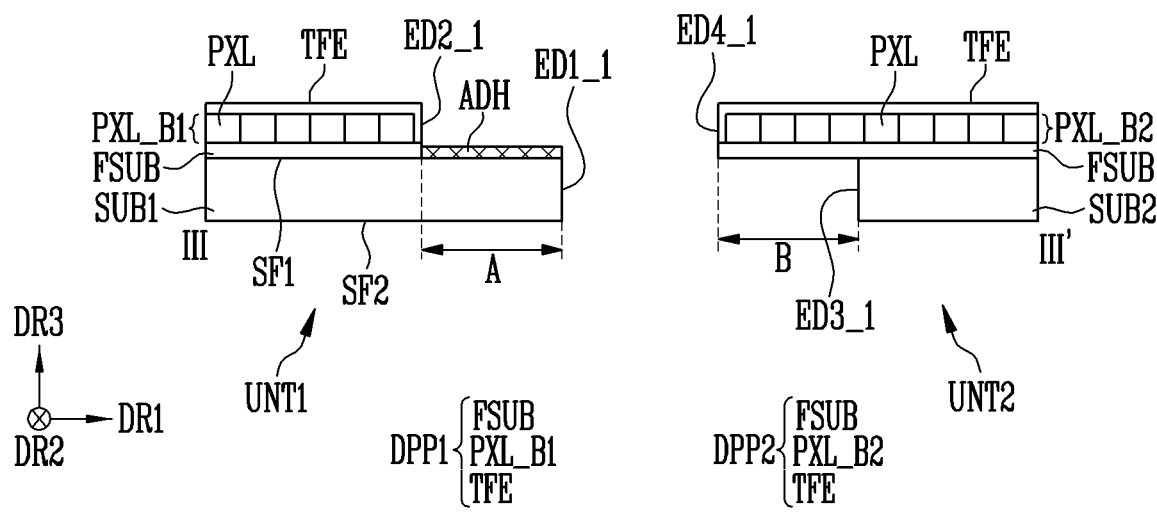
FIG. 13E illustrates a cross-sectional view taken along the line III-III' of FIG. 12E.
Figure 13F:
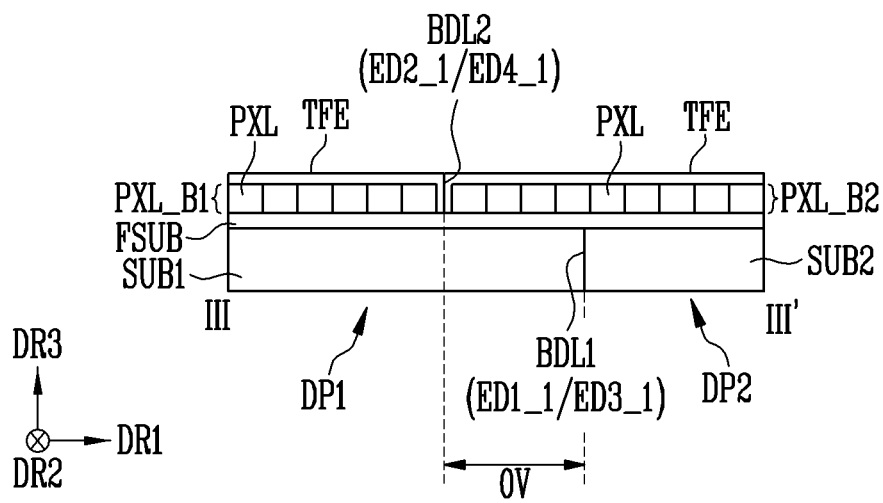
FIG. 13F illustrates a cross-sectional view taken along the line III-III' of FIG. 12F.

FIG. 12A to FIG. 12F are schematic top plan views sequentially showing a manufacturing method of a display device according to some embodiments of the present invention, FIG. 13A illustrates a cross-sectional view taken along the line III-III' of FIG. 12A, FIG. 13B illustrates a cross-sectional view taken along the line III-III' of FIG. 12B, FIG. 13C illustrates a cross-sectional view taken along the line III-III' of FIG. 12C, FIG. 13D illustrates a cross-sectional view taken along the line III-III' of FIG. 12D, FIG. 13E illustrates a cross-sectional view taken along the line III-III' of FIG. 12E, and FIG. 13F illustrates a cross-sectional view taken along the line III-III' of FIG. 12F.

Hereinafter, a manufacturing method of the display device shown in FIG. 6B and FIG. 7 will be sequentially described with reference to FIG. 12A to FIG. 12F and FIG. 13A to FIG. 13F in combination.

In the present specification, although manufacturing steps of the display device are described as being performed sequentially according to the top plan views and the cross-sectional views, it is obvious that some steps shown as being continuously performed are simultaneously performed, the order of respective steps is changed, some steps are omitted, or another step is added between respective steps unless the spirit of the invention is changed.

Referring to FIG. 6B, FIG. 7, FIG. 12A, and FIG. 13A, the first and second display portions DPP1 and DPP2 are formed on a mother substrate MSUB.

The mother substrate MSUB may include at least one or more of unit area. The unit area is a portion corresponding to an individual display panel or an individual display device, and a substrate of an individual display panel or of an individual display device may be formed for each unit area. For example, the mother substrate MSUB may include two unit areas, and one (hereinafter referred to as a 'first unit area') of the two unit areas may be the first substrate SUB1 of the first display panel DP1, and the other (hereinafter referred to as a 'second unit area') of the two unit areas may be the second substrate SUB2 of the second display panel DP2. In the mother substrate MSUB, the first unit area and the second unit area have the same size (or area), and may be arranged in a matrix shape, but embodiments according to the present invention are not limited thereto. According to some embodiments, the first unit area and the second unit area have different sizes (or areas) in the parent substrate MSUB, and may be arranged in various forms according to the size (or area) of the mother substrate MSUB.

The first display portion DPP1 may be located on the first unit area of the mother substrate MSUB, and the second display portion DPP2 may be located on the second unit area of the mother substrate MSUB.

The first display portion DPP1 may include a base layer BSL, a first pixel block PXL_B1 including a plurality of pixels PXL, and the thin film encapsulation layer TFE. The second display portion DPP2 may include the base layer BSL, a second pixel block PXL_B2 including a plurality of pixels PXL, and the thin film encapsulation layer TFE. The base layer BSL and the thin film encapsulation layer TFE may be a common layer commonly provided to the first display portion DPP1 and the second display portion DPP2. The base layer BSL may be formed of flexible polyimide. The thin film encapsulation layer TFE may be provided on the first and second pixel blocks PXL_B1 and PXL_B2 to protect pixels PXL included in the corresponding pixel block.

The base layer BSL and the thin film encapsulation layer TFE may be located on an area of the mother substrate MSUB between the first display portion DPP1 and the second display portion DPP2.

Referring to FIG. 6B, FIG. 7, FIG. 12B, and FIG. 13B, a laser cutting and scribing process is performed to remove a portion of the mother substrate MSUB to form separated first and second units UNT1 and UNT2. Common layers located on a partial area of the mother substrate MSUB removed in the above-described process, for example, the base layer BSL and the thin film encapsulation layer TFE may be removed together.

According to some embodiments, the first unit UNT1 may include the first substrate SUB1, and the first display portion DPP1 located on the first substrate SUB1. The first display portion DPP1 may include the flexible substrate FSUB located between the first substrate SUB1 and the first pixel block PXL_B1. The flexible substrate FSUB may be formed by removing a portion of the base layer BSL by the above-described process.

The second unit UNT2 may include the second substrate SUB2, and the second display portion DPP2 located on the second substrate SUB2. The second display portion DPP2 may include the flexible substrate FSUB located between the second substrate SUB2 and the second pixel block PXL_B2.

The flexible substrate FSUB may be formed by removing a portion of the base layer BSL by the above-described process.

Referring to FIG. 6B, FIG. 7, FIG. 12C, and FIG. 13C, a cutting and detaching process using a laser is performed so that a portion of the base layer BSL and the thin film encapsulation layer TFE that do not overlap the first pixel block PXL_B1 in the first unit UNT1 is removed.

In the above-described process, a portion of the first surface SF1 of the first substrate SUB1 may be exposed to the outside. In this case, the (1-1)-th edge ED1_1 of the first substrate SUB1 may be arranged to be closer to the second unit UNT2 than the (2-1)-th edge ED2_1 of the first display portion DPP1. Accordingly, the first substrate SUB1 may protrude toward the second unit UNT2 by an interval (e.g., a set or predetermined interval) A from the (2-1)-th edge ED2_1 of the first display portion DPP1.

Referring to FIG. 6B, FIG. 7, FIG. 12D, and FIG. 13D, a portion of the second substrate SUB2 is removed from the second unit UNT2 by performing a detaching and scribing process using a laser. In the above-described process, a lower surface of the second display portion DPP2 may be exposed to the outside. In this case, the (4-1)-th edge ED4_1 of the second display portion DPP2 may be arranged to be closer to the first unit UNT1 than the (3-1)-th edge ED3_1 of the second substrate SUB2. Accordingly, the second display portion DPP2 may protrude toward the first unit UNT1 by an interval (e.g., a set or predetermined interval) B from the (3-1)-th edge ED3_1 of the second substrate SUB2. According to some embodiments, the interval (e.g., the set or predetermined interval) B may be the same as the interval (e.g., the set or predetermined interval) A by which the first substrate SUB1 protrudes from the first display portion DPP1 toward the second unit UNT2, but the present invention is not limited thereto.

Referring to FIG. 6B, FIG. 7, FIG. 12E, and FIG. 13E, the adhesive material ADH (or bonding material) is applied on the first surface SF1 the exposed first substrate SUB1 through an inkjet printing method or the like. The adhesive material ADH (or bonding material) may include a transparent and/or opaque resin having adhesiveness (or bonding property).

Referring to FIG. 6B, FIG. 7, FIG. 12F, and FIG. 13F, after arranging the second display portion DDP2 protruding on the adhesive material ADH, the first unit (see 'UNT1' in FIG. 12E) and the second unit (see 'UNT2' in FIG. 12E) are combined.

In the above-described combining process, the (1-1)-th edge ED1_1 of the first substrate SUB1 and the (3-1)-th edge ED3_1 of the second substrate SUB2 may be engaged with each other, so that they may be arranged to be adjacent to each other with the first boundary line BDL1 (or bonding portion) interposed therebetween. In addition, in the above-described combining process, the (2-1)-th edge ED2_1 of the first display portion DPP1 and the (4-1)-th edge ED4_1 of the second display portion DPP2 may be engaged with each other, so that they may be arranged to be adjacent to each other with the second boundary line BDL2 (or bonding portion) interposed therebetween. Accordingly, the first display portion DPP1 and the second display portion DDP2 are continuously arranged in the first direction DR1, so that the non-display area between the first display panel DP1 and the second display panel DP2 may be minimized.

The first unit UNT1 described above may be the first display panel DP1, and the second unit UNT2 described above may be the second display panel DP2. The first display panel DP1 and the second display panel DP2 may be combined to implement one display device, for example, a multi-screen display device.

Figure 14A:
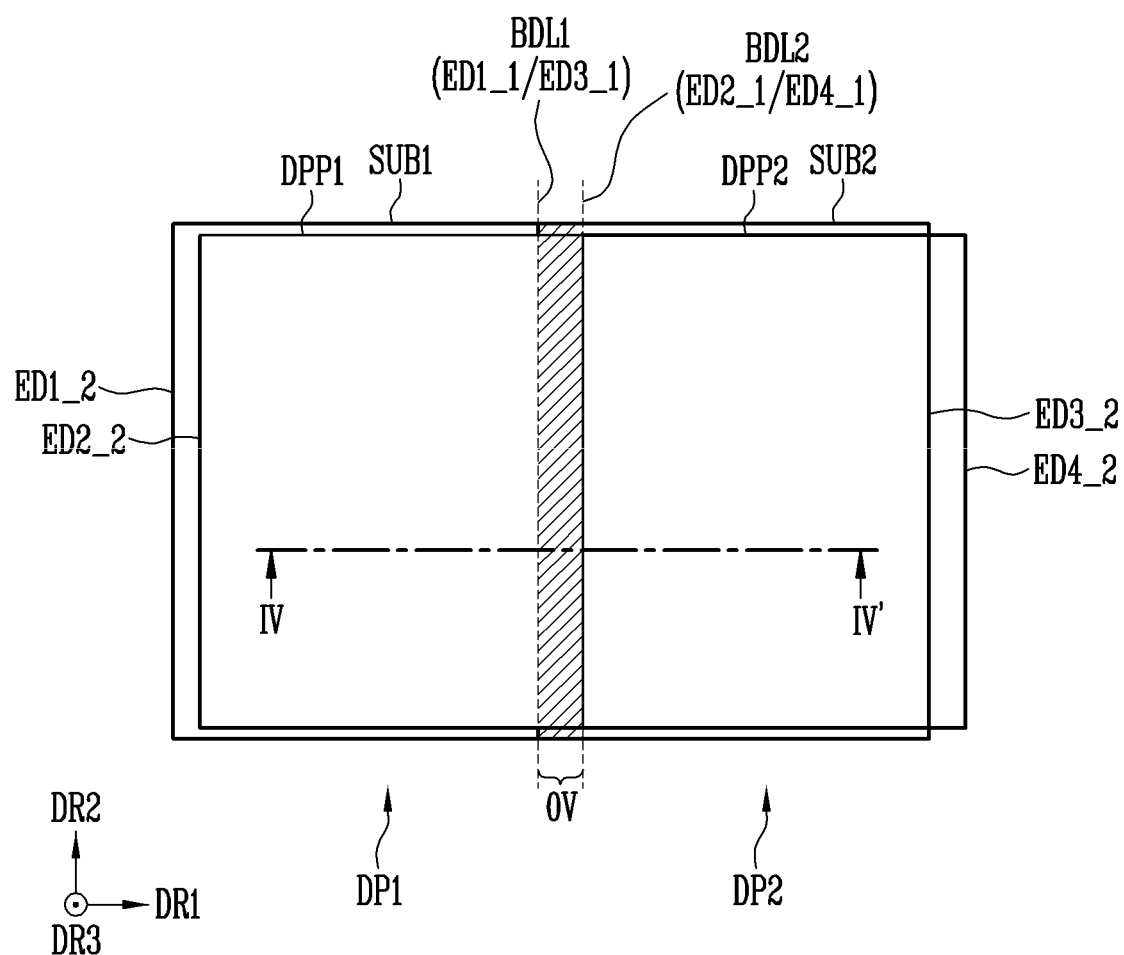
FIG. 14A illustrates a schematic top plan view of a display device according to some embodiments of the present invention.

FIG. 14A illustrates a schematic top plan view of a display device according to some embodiments of the present invention, FIG. 14B illustrates a cross-sectional view taken along the line IV-IV' of FIG. 14A, and FIG. 14C illustrates a schematic cross-sectional view of a state in which a first display panel and a second display panel of FIG. 14B are separated.

In relation to the display device of FIG. 14A to FIG. 14C, differences from the above-described embodiments will be mainly described in order to avoid duplicate descriptions. Constituent elements not specifically described in the present invention refer to the embodiments described above, the same reference numerals designate the same constituent elements, and the similar reference numerals designate the similar constituent elements.

Referring to FIG. 14A to FIG. 14C, the display device according to some embodiments may include the first display panel DP1 and the second display panel DP2 arranged to be adjacent to each other in the first direction DR1.

The first display panel DP1 may include the first substrate SUB1, the first display portion DPP1, and the driver DRP. The driver DRP may be electrically connected to the first display portion DPP1 through the conductive material CM and the flexible circuit film COF arranged in the contact hole CH penetrating the first substrate SUB1.

The first substrate SUB1 may include the (1-1)-th edge ED1_1 and the (1-2) edge ED1_2 facing each other in the first direction DR1. In addition, the first substrate SUB1 may include the first surface SF1 and the second surface SF2 facing each other in the third direction DR3.

The first display portion DPP1 may include the (2-1)-th edge ED2_1 and the (2-2)-th edge ED2_2 facing each other in the first direction DR1. When viewed in a plan view, the (2-1)-th edge ED2_1 may be arranged to be adjacent to the (1-1)-th edge ED1_1, and the (2-2)-th edge ED2_2 may be arranged to be adjacent to the (1-2)-th edge ED1_2.

When viewed in a plan view and a cross-sectional view, the (1-1)-th edge ED1_1 and the (2-1)-th edge ED2_1 do not coincide with each other, and may be spaced apart from each other at a distance (e.g., a set or predetermined distance) d. For example, the (2-1)-th edge ED2_1 may be arranged to be closer to the second display panel DP2 than the (1-1)-th edge ED1_1 in the first direction DR1. In this case, the first display portion DPP1 may protrude toward the second display panel DP2 compared to the first substrate SUB1 in the first direction DR1, in a plan view.

When viewed in a plan view, the (1-2)-th edge ED1_2 and the (2-2)-th edge ED2_2 do not coincide with each other, and may be spaced apart from each other. For example, the (1-2)-th edge ED1_2 may be arranged to be farther from the second display panel DP2 than the (2-2)-th edge ED2_2 in the first direction DR1, but the present invention is not limited thereto.

The second display panel DP2 may include the second substrate SUB2, the second display portion DPP2, and the driver DRP. The driver DRP2 may be electrically connected to the second display portion DPP2 through the conductive material CM and the flexible circuit film COF arranged in the contact hole CH penetrating the second substrate SUB2.

The second substrate SUB2 may include a (3-1)-th edge ED3_1 and a (3-2) edge ED3_2 facing each other in the first direction DR1. The second substrate SUB2 may include the first surface SF1 and the second surface SF2 facing each other in the third direction DR3.

The second display portion DPP2 may include the (4-1)-th edge ED4_1 and the (4-2) edge ED4_2 facing each other in the first direction DR1. When viewed in a plan view, the (3-1)-th edge ED3_1 may be arranged to be adjacent to the (4-1)-th edge ED4_1, and the (4-2)-th edge ED4_2 may be arranged to be adjacent to the (3-2)-th edge ED3_2.

When viewed in a plan view and a cross-sectional view, the (3-1)-th edge ED3_1 and the (4-1)-th edge ED4_1 do not coincide with each other, and may be spaced apart from each other at a distance (e.g., a set or predetermined distance) d. As an example, the (3-1)-th edge ED3_1 may be arranged to be closer to the second display panel DP2 than the (4-1)-th edge ED4_1 in the first direction DR1. In this case, the second substrate SUB2 may protrude toward the second display panel DP2 compared to the compared to the second display portion DPP2 in the first direction DR1, in a cross-sectional view. Accordingly, the first surface SF1 of the second substrate SUB2 corresponding to the (3-1)-th edge ED3_1 may be exposed to the outside.

When viewed in a plan view, the (3-2)-th edge ED3_2 and the (4-2)-th edge ED4_2 do not coincide with each other, and may be spaced apart from each other. For example, the (4-2)-th edge ED4_2 may be arranged to be farther from the first display panel DP1 than the (3-2)-th edge ED3_2 in the first direction DR1, but the present invention is not limited thereto.

The first and second boundary lines BDL1 and BDL2 extending in the second direction DR2 may be arranged between the first display panel DP1 and the second display panel DP2. The first boundary line BDL1 and the second boundary line BDL2 do not coincide with each other, and may be spaced apart from each other in the first direction DR1. For example, the first boundary line BDL1 may be arranged to be adjacent to the first display panel DP1 between the first display panel DP1 and the second display panel DP2, and the second boundary line BDL2 may be arranged to be adjacent to the second display panel DP2 between the first display panel DP1 and the second display panel DP2.

The first boundary line BDL1 may correspond to a boundary between the (1-1)-th edge ED1_1 and the (3-1)-th edge ED3_1. That is, the first boundary line BDL1 may correspond to a boundary (or bonding portion) between the first substrate SUB1 and the second substrate SUB2. The second boundary line BDL2 may correspond to a boundary between the (2-1)-th edge ED2_1 and the (4-1)-th edge ED4_1. That is, the second boundary line BDL2 may correspond to a boundary (or bonding portion) between the first display portion DPP1 and the second display portion DPP2. According to some embodiments, the first boundary line BDL1 may overlap some constituent elements of the first display panel DP1, for example, the first display portion DPP1 when viewed in a cross-sectional view. In addition, the second boundary line BDL2 may overlap some constituent elements of the second display panel DP2, for example, the second substrate SUB2 when viewed in a cross-sectional view.

The first display panel DP1 and the second display panel DP2 described above may be combined to implement the display device, for example, a multi-screen display device. In this case, some elements of the first display panel DP1 are arranged on some elements of the second display panel DP2, so that the first display panel DP1 and the second display panel DP2 may be combined. As an example, as shown in FIG. 14C, an adhesive material ADH (or bonding material) is applied on the first surface SF1 of the second substrate SUB2 exposed at the (3-1)-th edge ED3_1, and the first display portion DPP1 protruding compared to the first substrate SUB1 is arranged on the adhesive material ADH, and then a multi-screen display device may be implemented by combining the first display panel DP1 and the second display panel DP2.

The multi-screen display device may include the overlapping area OV in which the first display panel DP1 and the second display panel DP2 partially overlap. The overlapping area OV may be an area provided by arranging the first display portion DDP1 protruding compared to the first substrate SUB1 on the second substrate SUB2 protruding compared to the second display portion DDP2 between the first display panel DP1 and the second display panel DP2. In the overlapping area OV, the second boundary line BDL2 may be arranged to be closer to the second display panel DP2 than the first boundary line BDL1 in the first direction DR1. In addition, the first boundary line BDL1 may be arranged to be closer to the first display panel DP1 than the second boundary line BDL2 in the first direction DR1 in the overlapping area OV.

The first display panel DP1 including the first substrate SUB1 and the first display portion DPP1 may be arranged to be engaged with the second display panel DP2 including the second substrate SUB2 and the second display portion DPP2 in the first direction DR1 to implement a single multi-screen display device. As described above, as the first display portion DPP1 of the first display panel DP1 is located on the second substrate SUB2 of the second display panel DP2, the first display portion DPP1 and the second display portion DPP2 may be continuously arranged along the first direction DR1. In this case, a width and/or area of the non-display area between the first display panel DP1 and the second display panel DP2 may be minimized or substantially eliminated. In addition, for example, because the first boundary line BDL1 is arranged under the second display portion DPP2, it is possible to prevent or reduce the seam area corresponding to the bonding portion between the first substrate SUB1 and the second substrate SUB2 from being viewed, so that a more natural image may be displayed even in the boundary area.

Figure 15A:
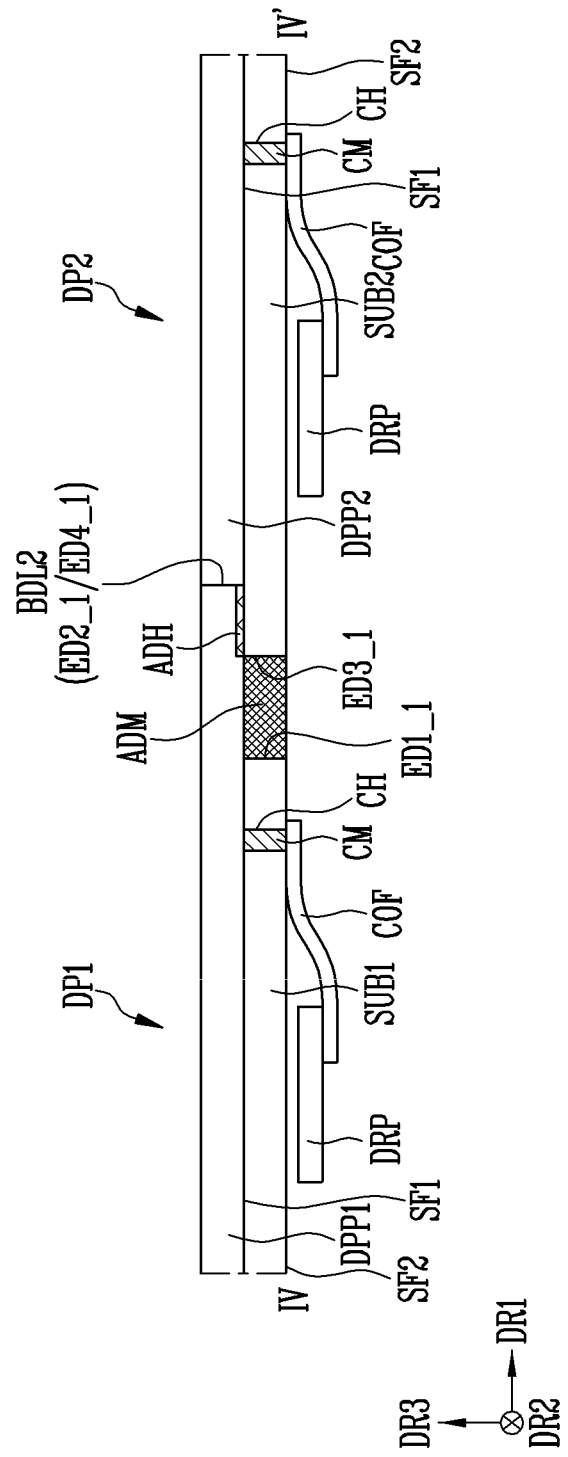
FIG. 15A illustrates a schematic top plan view of a display device according to some embodiments of the present invention.
Figure 15B:
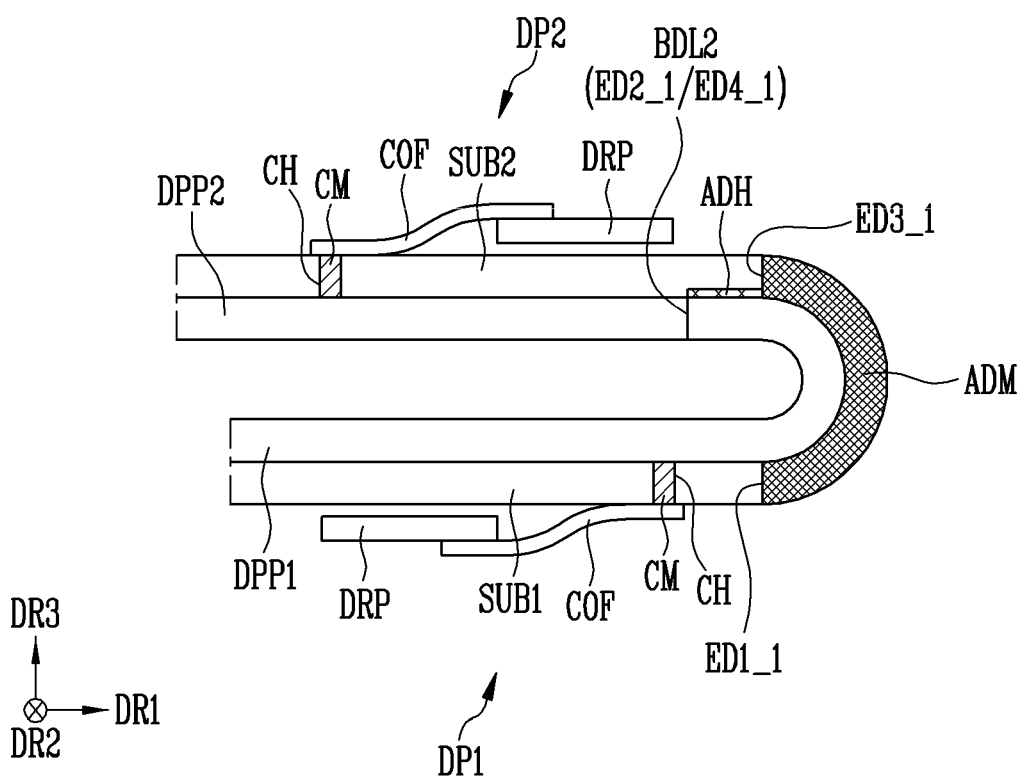
FIG. 15B illustrates a state in which the display device of FIG. 15A is folded, and illustrates a cross-sectional view taken along the line IV-IV' of FIG. 14A.

FIG. 15A illustrates a schematic top plan view of a display device according to some embodiments of the present invention, and FIG. 15B illustrates a state in which the display device of FIG. 15A is folded, and illustrates a cross-sectional view taken along the line IV-IV' of FIG. 14A.

The display device illustrated in FIG. 15A and FIG. 15B may have configurations substantially the same as or similar to those of the display device shown in FIG. 14A to FIG. 14C, except that an additional material ADM is arranged between the first substrate SUB1 and the second substrate SUB2.

Therefore, in relation to the display device of FIG. 15A and FIG. 15B, differences from the above-described embodiments will be mainly described in order to avoid duplicate descriptions.

Referring to FIG. 15A and FIG. 15B, the display device according to some embodiments may include the first display panel DP1 and the second display panel DP2 arranged to be adjacent to each other in the first direction DR1.

The above-described display device may be a multi-screen display device implemented by arranging the first display portion DPP1 of the first display panel DP1 on the second substrate SUB2 of the second display panel DP2 and then by combining the first display panel DP1 and the second display panel DP2.

The first display portion DPP1 of the first display panel DP1 and the second display unit DPP2 of the second display panel DP2 may be continuously arranged in the first direction DR1 with the second boundary line BDL2 interposed therebetween. The second boundary line BDL2 may overlap some constituent elements of the second display panel DP2, for example, the second substrate SUB2 when viewed in a cross-sectional view.

According to some embodiments, the (1-1)-th edge ED1_1 of the first substrate SUB1 of the first display panel DP1 may be spaced apart from each other by a distance (e.g., a set or predetermined distance) from the (3-1)-th edge ED3_1 of the second substrate SUB2 of the second display panel DP2 in the first direction DR1. In some embodiments, the additional material ADM may be provided and/or formed between the (1-1) edge ED1_1 and the (3-1)-th edge ED3_1 that are spaced apart from each other in the first direction DR1.

The additional material ADM may include a flexible resin. For example, the additional material ADM may be configured in a film form including one of a polyester-based polymer, a silicon-based polymer, an acryl-based polymer, a polyolefin-based polymer, and a copolymer thereof, but is not limited thereto. The additional material ADM may be printed between the first substrate SUB1 and the second substrate SUB2 through an inkjet printing method or the like.

According to some embodiments, a thickness of the additional material ADM in the third direction DR3 may be the same as that of each of the first and second substrates SUB1 and SUB2 in the third direction DR3, but the present invention is not limited thereto. In some embodiments, the thickness of the additional material ADM in the third direction DR3 may be different from that of each of the first and second substrates SUB1 and SUB2 in the third direction DR3. For example, the thickness of the additional material ADM in the third direction DR3 may be thinner or thicker than that of each of the first and second substrates SUB1 and SUB2 in the third direction DR3. In addition, an area (or size) of the additional material ADM may be equal to or larger than an area (or size) of a pixel area in which at least one pixel (see 'PXL' in FIG. 4A) included in each of the first and second display portions DPP1 and DPP2 is provided, but the present invention is not limited thereto.

When the flexible additional material ADM is located between the first substrate SUB1 and the second substrate SUB2, the area in which the additional material ADM is located may be folded to implement a folder type of display device. In the embodiments of the present invention, the term such as "folded" mean that a shape is not fixed, but its original shape may be changed into another shape, and it may include a structure in which a specific area may be folded, curved, or rolled. For convenience, FIG. 15B illustrates the state in which the first display portion DPP1 and the second display portion DPP2 are folded to face each other, but the present invention is not limited thereto, and according to some embodiments, the first display portion DPP1 and the second display portion DPP1 may be folded at an angle (e.g., a set or predetermined angle) (for example, acute angle, right angle, or obtuse angle) with the additional material ADM therebetween.

While aspects of some embodiments of the present invention have been shown and described with reference to certain embodiments thereof, it will be understood by those skilled in the art that various changes in forms and details may be made therein without departing from the spirit and scope of embodiments according to the present invention as defined by the appended claims and their equivalents.

Therefore, the technical scope of embodiments according to the present disclosure may be determined by on the technical scope of the accompanying claims and their equivalents.

What is claimed is:

1. A display device comprising first and second display panels adjacent to each other along one direction, wherein:
    each of the first and second display panels includes a substrate, and a display portion on the substrate and including a plurality of pixels;
    each of the pixels includes:
        a pixel circuit layer on the substrate and including a transistor;
        a display element layer on the pixel circuit layers; and
        at least one light emitting element for emitting light;
    the substrate of the first display panel and the substrate of the second display panel each comprise a first surface and a second surface opposite from each other, and are engaged with each other in a plan view and a cross-sectional view;
    the display portion of the first display panel and the display portion of the second display panel each comprise a first surface and a second surface opposite from each other, and are engaged with each other in the plan view and the cross-sectional view;
    the first surfaces of the substrates of the first and second display panels are coplanar with each other;
    the second surfaces of the substrates of the first and second display panels are coplanar with each other; and
    a first boundary between the substrate of the first display panel and the substrate of the second display panel, and a second boundary between the display portion of the first display panel, and the display portion of the second display panel, are spaced apart from each other in the one direction.

2. The display device of claim 1, further comprising an overlapping portion in which the first display panel and the second display panel overlap,
    wherein, in the plan view and the cross-sectional view, the overlapping portion is between the first boundary and the second boundary.

3. The display device of claim 2, wherein the display portion further includes a flexible substrate between the first surface of the substrate and the plurality of pixels.

4. The display device of claim 3, wherein at least a portion of the display portion of one of the first and second display panels is on the first surface of the substrate of the other one of the first and second display panels in the overlapping portion.

5. The display device of claim 4, wherein at least a portion of the display portion of the second display panel is on the first surface of the substrate of the first display panel in the overlapping portion.

6. The display device of claim 5, further comprising an adhesive layer on the first surface of the substrate of the first display panel in the overlapping portion,
    wherein the display portion of the second display panel is on the adhesive layer.

7. The display device of claim 5, wherein in the plan view and the cross-sectional view, the first boundary overlaps the display portion of the second display panel, and
    wherein, in the plan view and the cross-sectional view, the second boundary overlaps the substrate of the first display panel.

8. The display device of claim 7, wherein, in the cross-sectional view, the first boundary is below the display portion of the second display panel.

9. The display device of claim 5, wherein an edge of the substrate of the first display panel protrudes further toward the second display panel than an edge of the display portion of a the first display panel.

10. The display device of claim 9, wherein an edge of the display portion of the second display panel protrudes further toward the first display panel than an edge of the substrate of a the second display panel.

11. The display device of claim 4, wherein at least a portion of the display portion of the first display panel is on the first surface of the substrate of the second display panel.

12. The display device of claim 11, wherein, in the plan view and the cross-sectional view, the first boundary overlaps the display portion of the first display panel, and wherein, in the plan view and the cross-sectional view, the second boundary overlaps the substrate of the second display panel.

13. The display device of claim 12, wherein an edge of the substrate of the second display panel protrudes further toward the first display panel than an edge of the display portion of a the second display panel.

14. The display device of claim 13, wherein an edge of the display portion of the first display panel protrudes further toward the second display panel than an edge of the substrate of the first display panel.

15. The display device of claim 14, wherein, in the cross-sectional view, the first boundary is below the display portion of the first display panel.

16. The display device of claim 14, further comprising an additional member that is between the substrate of the first display panel and the substrate of the second display panel, that is flexible, and that contacts the display portion of the first display panel.

17. The display device of claim 4, wherein each of the first and second display panels further includes:
- at least one contact hole penetrating at least one area of the substrate of a corresponding display panel;
- a conductive material in the at least one contact hole; and
- a driver on the second surface of the substrate and electrically connected to the conductive material.

18. The display device of claim 1, wherein the light emitting element includes:
- a first electrode electrically connected to the transistor;
- an emission layer on the first electrode; and
- a second electrode on the emission layer.

19. A display device comprising first and second display panels adjacent to each other along one direction,
wherein each of the first and second display panels includes a substrate, and a display portion on the substrate and including pixels,
wherein each of the pixels includes:
- a pixel circuit layer on the substrate and including at least one transistor;
- a display element layer on the pixel circuit layer; and
- at least one light emitting element for emitting light,
wherein the substrate of the first display panel and the substrate of the second display panel are engaged with each other in a plan view and a cross-sectional view,
wherein the display portion of the first display panel and the display portion of the second display panel are engaged with each other in the plan view and the cross-sectional view,
wherein a first boundary between the substrate of the first display panel and the substrate of the second display panel, and a second boundary between the display portion of the first display panel and the display portion of the second display panel, are spaced apart from each other in the one direction, and
wherein the light emitting element includes:
- a first semiconductor layer doped with a first conductive dopant;
- a second semiconductor layer doped with a second conductive dopant different from the first conductive dopant; and
- an active layer between the first semiconductor layer and the second semiconductor layer.

20. A manufacturing method of a display device, comprising:
- preparing a mother substrate in which a first display portion and a second display portion are provided;
- separating the mother substrate into a first substrate provided with the first display portion and a second substrate provided with the second display portion by removing a portion of the mother substrate;
- removing at least a portion of the first display portion to expose one surface of the first substrate;
- removing at least a portion of the second substrate to expose at least a portion of the second display portion;
- applying an adhesive resin on the one surface of the first substrate; and
- bonding the first substrate and the second substrate after applying the second display portion on the adhesive resin.

* * * * *

UNITED STATES PATENT AND TRADEMARK OFFICE
CERTIFICATE OF CORRECTION

| | | |
|---|---|---|
| PATENT NO. | : 11,882,728 B2 | Page 1 of 1 |
| APPLICATION NO. | : 17/444271 | |
| DATED | : January 23, 2024 | |
| INVENTOR(S) | : Won Tae Kim et al. | |

It is certified that error appears in the above-identified patent and that said Letters Patent is hereby corrected as shown below:

In the Claims

In Column 34, Line 33, in Claim 1, delete "panel," and insert -- panel --.

In Column 35, Line 4, in Claim 9, delete "of a" and insert -- of --.

In Column 35, Line 8, in Claim 10, delete "of a" and insert -- of --.

In Column 35, Line 21, in Claim 13, delete "of a" and insert -- of --.

Signed and Sealed this
Seventh Day of May, 2024

*Katherine Kelly Vidal*

Katherine Kelly Vidal
*Director of the United States Patent and Trademark Office*